US012791936B2

(12) United States Patent
Sriraman et al.

(10) Patent No.: US 12,791,936 B2
(45) Date of Patent: Nov. 10, 2026

(54) RESIST AND ETCH MODELING

(71) Applicant: Lam Research Corporation, Fremont, CA (US)

(72) Inventors: Saravanapriyan Sriraman, Fremont, CA (US); David M. Fried, Monte Sereno, CA (US)

(73) Assignee: Lam Research Corporation, Fremont, CA (US)

( * ) Notice: Subject to any disclaimer, the term of this patent is extended or adjusted under 35 U.S.C. 154(b) by 799 days.

(21) Appl. No.: 18/174,293

(22) Filed: Feb. 24, 2023

(65) Prior Publication Data

US 2023/0205076 A1 Jun. 29, 2023

Related U.S. Application Data

(62) Division of application No. 17/045,168, filed as application No. PCT/US2019/026396 on Apr. 8, 2019, now Pat. No. 11,624,981.

(Continued)

(51) Int. Cl.
*G03F 1/70* (2012.01)
*G03F 1/80* (2012.01)

(Continued)

(52) U.S. Cl.
CPC .................. *G03F 1/70* (2013.01); *G03F 1/80* (2013.01); *G03F 7/705* (2013.01); *G03F 7/70508* (2013.01); *H10P 74/203* (2026.01)

(58) Field of Classification Search
CPC .............. G03F 1/70; G03F 1/80; G03F 7/705; G03F 7/70508; H01L 22/12

(Continued)

(56) References Cited

U.S. PATENT DOCUMENTS 5,114,233 A 5/1992 Clark et al.
5,421,934 A 6/1995 Misaka et al.

(Continued)

FOREIGN PATENT DOCUMENTS

CN 1501178 A 6/2004
CN 1739185 A 2/2006

(Continued)

OTHER PUBLICATIONS

Abdo (2010) "The feasibility of using image parameters for test pattern selection during OPC model calibration," Proc. of SPIE, 7640:76401E-1-76401E-11.

(Continued)

*Primary Examiner* — Suchin Parihar
(74) *Attorney, Agent, or Firm* — Weaver Austin Villeneuve & Sampson LLP

(57) ABSTRACT

Computer implemented methods and computer program products have instructions for generating transfer functions that relate segments on lithography photomasks to features produced by photolithography and etching using such segments. Such methods may be characterized by the following elements: (a) receiving after development inspection metrology results produced from one or more first test substrates on which resist was applied and patterned using a set of design layout segments; (b) receiving after etch inspection metrology results produced from one or more second test substrates which were etched after resist was applied and patterned using said set of design layout segments; and (c) generating the transfer function using the set of design layout segments together with corresponding after development inspection metrology results and corresponding after etch inspection metrology results.

20 Claims, 8 Drawing Sheets

Related U.S. Application Data

(60) Provisional application No. 62/655,495, filed on Apr. 10, 2018.

(51) Int. Cl.
*G03F 7/00* (2006.01)
*H10P 74/20* (2026.01)

(58) Field of Classification Search
USPC ........................................................ 716/51
See application file for complete search history.

(56) References Cited

U.S. PATENT DOCUMENTS 6,268,226 B1 7/2001 Angell et al.
6,410,351 B1 6/2002 Bode et al.
6,650,423 B1 11/2003 Markle et al.
6,684,382 B2 1/2004 Liu
6,753,115 B2 6/2004 Zhang et al.
6,765,651 B1 7/2004 Fiekowsky et al.
6,804,572 B1 10/2004 Cooperberg et al.
6,869,739 B1 3/2005 Ausschnitt et al.
6,903,826 B2 6/2005 Usui et al.
6,943,900 B2 9/2005 Niu et al.
7,139,632 B2 11/2006 Cooperberg et al.
7,402,257 B1 7/2008 Sonderman et al.
7,504,182 B2 3/2009 Stewart et al.
7,588,946 B2 9/2009 Tso et al.
7,600,212 B2 10/2009 Zach et al.
7,739,651 B2 6/2010 Melvin, III et al.
7,812,966 B2 10/2010 Hoffmann et al.
7,849,423 B1 12/2010 Yenikaya et al.
7,921,383 B1 4/2011 Wei
7,962,867 B2 6/2011 White et al.
7,967,995 B2 6/2011 Funk et al.
8,001,512 B1 8/2011 White
8,019,458 B2 * 9/2011 Funk ..................... G05B 17/02 216/2
8,102,408 B2 1/2012 Verma et al.
8,279,409 B1 10/2012 Sezginer et al.
8,832,610 B2 9/2014 Ye et al.
9,015,016 B2 4/2015 Lorenz et al.
9,245,761 B2 1/2016 Singh et al.
9,448,470 B2 9/2016 Liu et al.
9,471,746 B2 10/2016 Rieger et al.
9,547,740 B2 1/2017 Moroz et al.
9,659,126 B2 5/2017 Greiner et al.
9,792,393 B2 10/2017 Tetiker et al.
9,996,647 B2 6/2018 Tetiker et al.
10,032,681 B2 7/2018 Bailey, III et al.
10,197,908 B2 2/2019 Sriraman et al.
10,254,641 B2 4/2019 Mailfert et al.
10,303,830 B2 5/2019 Tetiker et al.
10,386,828 B2 8/2019 Tetiker et al.
10,409,946 B2 9/2019 Ünal et al.
10,495,967 B2 12/2019 Huang et al.
10,534,257 B2 1/2020 Tetiker et al.
10,572,697 B2 2/2020 Feng et al.
10,585,347 B2 3/2020 Sriraman et al.
10,712,672 B2 7/2020 Jochemsen et al.
10,977,405 B2 4/2021 Bowes et al.
10,997,345 B2 5/2021 Feng et al.
11,624,981 B2 4/2023 Sriraman et al.
11,704,463 B2 7/2023 Feng et al.
11,921,433 B2 3/2024 Feng et al.
2002/0012876 A1 1/2002 Angelopoulos et al.
2002/0156609 A1 10/2002 Hirata et al.
2003/0008507 A1 1/2003 Bell et al.
2003/0113766 A1 6/2003 Pepper et al.
2003/0118917 A1 6/2003 Zhang et al.
2003/0208728 A1 11/2003 Pierrat
2003/0228532 A1 * 12/2003 Mui .................... G03F 7/70625 430/30
2004/0019872 A1 1/2004 Lippincott et al.
2004/0070772 A1 4/2004 Shchegrov et al.
2005/0074907 A1 4/2005 Kriz et al.
2005/0192914 A1 9/2005 Drege et al.
2006/0064280 A1 3/2006 Vuong et al.
2006/0141484 A1 6/2006 Rucker et al.
2006/0160015 A1 7/2006 Takano et al.
2006/0208205 A1 9/2006 Chen et al.
2007/0031745 A1 2/2007 Ye et al.
2007/0050749 A1 3/2007 Ye et al.
2007/0061772 A1 3/2007 Ye et al.
2007/0061773 A1 3/2007 Ye et al.
2007/0087273 A1 4/2007 Look et al.
2007/0249071 A1 10/2007 Lian et al.
2007/0281478 A1 12/2007 Ikegami et al.
2008/0007739 A1 1/2008 Vuong et al.
2008/0035608 A1 2/2008 Thomas et al.
2008/0072207 A1 3/2008 Verma et al.
2008/0078948 A1 4/2008 Saito
2008/0243730 A1 10/2008 Bischoff et al.
2009/0048813 A1 2/2009 Ichikawa et al.
2009/0087143 A1 4/2009 Jeon et al.
2009/0126589 A1 5/2009 Maxwell et al.
2009/0242513 A1 10/2009 Funk et al.
2009/0253222 A1 10/2009 Morisawa et al.
2010/0036514 A1 * 2/2010 Funk ..................... G05B 17/02 700/103
2010/0255218 A1 10/2010 Oka et al.
2011/0022215 A1 1/2011 Keil et al.
2011/0091815 A1 4/2011 Dunn et al.
2011/0138343 A1 6/2011 Granik
2011/0159690 A1 6/2011 Chandrashekar et al.
2011/0188732 A1 8/2011 Stroessner
2011/0292375 A1 12/2011 Marx et al.
2012/0002912 A1 1/2012 Studenkov et al.
2012/0009785 A1 1/2012 Chandrashekar et al.
2012/0022836 A1 1/2012 Ferns et al.
2012/0179282 A1 7/2012 Sarma et al.
2012/0228125 A1 9/2012 Wu et al.
2013/0171822 A1 7/2013 Chandrashekar et al.
2014/0032463 A1 1/2014 Jin et al.
2014/0123084 A1 5/2014 Tang et al.
2014/0302681 A1 10/2014 Paterson et al.
2015/0056803 A1 2/2015 Chandrashekar et al.
2015/0079500 A1 3/2015 Shih et al.
2015/0081081 A1 3/2015 Hui et al.
2015/0142395 A1 5/2015 Cao et al.
2015/0154145 A1 6/2015 Watanabe et al.
2015/0356233 A1 12/2015 Fouquet et al.
2015/0366523 A1 12/2015 Ben-Haim
2015/0371134 A1 12/2015 Chien et al.
2016/0078166 A1 3/2016 Ünal et al.
2016/0091769 A1 3/2016 Rozbicki
2016/0189971 A1 6/2016 Yi et al.
2016/0217233 A1 7/2016 Kamon et al.
2016/0284077 A1 9/2016 Brill
2016/0313651 A1 10/2016 Middlebrooks et al.
2016/0322267 A1 11/2016 Kim et al.
2016/0335384 A1 * 11/2016 Song ......................... G03F 1/80
2017/0004233 A1 * 1/2017 Han ...................... G06F 30/398
2017/0039308 A1 2/2017 Moroz et al.
2017/0103924 A1 4/2017 Park et al.
2017/0115556 A1 4/2017 Shim et al.
2017/0147724 A1 5/2017 Regli et al.
2017/0176983 A1 6/2017 Tetiker et al.
2017/0220723 A1 8/2017 Song et al.
2017/0228482 A1 8/2017 Tetiker et al.
2017/0256463 A1 9/2017 Bailey, III et al.
2017/0351952 A1 12/2017 Zhang et al.
2017/0363950 A1 12/2017 Sriraman et al.
2017/0365513 A1 12/2017 Yang et al.
2017/0371991 A1 12/2017 Tetiker et al.
2018/0068861 A1 3/2018 Devilliers
2018/0082415 A1 * 3/2018 Sezginer ................. G06T 7/001
2018/0157161 A1 6/2018 Mailfert et al.
2018/0182632 A1 6/2018 Feng et al.
2018/0239851 A1 8/2018 Ypma et al.
2018/0253015 A1 9/2018 Ypma et al.
2018/0260509 A1 9/2018 Tetiker et al.
2018/0269119 A1 * 9/2018 Coppa ............... H01L 21/31116
2018/0284597 A1 10/2018 Weisbuch et al.

(56) References Cited

U.S. PATENT DOCUMENTS

| | | | | |
|---|---|---|---|---|
| 2018/0314148 | A1 | 11/2018 | Tetiker et al. | |
| 2018/0364589 | A1 | 12/2018 | Chen et al. | |
| 2019/0049937 | A1 | 2/2019 | Tetiker et al. | |
| 2019/0163866 | A1* | 5/2019 | Liu | G06F 30/20 |
| 2019/0204749 | A1 | 7/2019 | Tel et al. | |
| 2019/0250501 | A1 | 8/2019 | Sriraman et al. | |
| 2019/0311083 | A1 | 10/2019 | Feng et al. | |
| 2019/0393105 | A1 | 12/2019 | Cho et al. | |
| 2020/0218844 | A1 | 7/2020 | Feng et al. | |
| 2020/0242209 | A1 | 7/2020 | Bowes et al. | |
| 2021/0035833 | A1 | 2/2021 | Feng et al. | |
| 2021/0080838 | A1 | 3/2021 | Tel et al. | |
| 2021/0150116 | A1* | 5/2021 | Fan | G03F 7/705 |
| 2021/0157228 | A1* | 5/2021 | Sriraman | G03F 1/80 |
| 2021/0165332 | A1 | 6/2021 | Van Adrichem et al. | |
| 2021/0216695 | A1 | 7/2021 | Feng et al. | |
| 2021/0374936 | A1 | 12/2021 | Koopman et al. | |

FOREIGN PATENT DOCUMENTS

| | | | |
|---|---|---|---|
| CN | 1799045 | A | 7/2006 |
| CN | 1868043 | A | 11/2006 |
| CN | 1940715 | A | 4/2007 |
| CN | 101151719 | A | 3/2008 |
| CN | 101313308 | A | 11/2008 |
| CN | 101359611 | A | 2/2009 |
| CN | 101517874 | A | 8/2009 |
| CN | 101976045 | A | 2/2011 |
| CN | 102765043 | A | 11/2012 |
| CN | 103109314 | A | 5/2013 |
| CN | 103187257 | A | 7/2013 |
| CN | 103809462 | A | 5/2014 |
| CN | 104103510 | A | 10/2014 |
| CN | 104518753 | A | 4/2015 |
| CN | 104736744 | A | 6/2015 |
| CN | 104820787 | A | 8/2015 |
| CN | 105516022 | A | 4/2016 |
| CN | 107526864 | A | 12/2017 |
| EP | 1720062 | A2 | 11/2006 |
| EP | 2549523 | A1 | 1/2013 |
| EP | 2980646 | A1 | 2/2016 |
| JP | 2002541663 | A | 12/2002 |
| JP | 2003092237 | A | 3/2003 |
| JP | 2004253516 | A | 9/2004 |
| JP | 2005277361 | A | 10/2005 |
| JP | 2005536074 | A | 11/2005 |
| JP | 2007219208 | A | 8/2007 |
| JP | 2008091673 | A | 4/2008 |
| JP | 2009152269 | A | 7/2009 |
| JP | 2009294308 | A | 12/2009 |
| JP | 2010034393 | A | 2/2010 |
| JP | 2011035366 | A | 2/2011 |
| JP | 2012186394 | A | 9/2012 |
| JP | WO2011115023 | A1 | 6/2013 |
| JP | 2015514160 | A | 5/2015 |
| JP | 2015103769 | A | 6/2015 |
| JP | 2015528569 | A | 9/2015 |
| JP | 2016033656 | A | 3/2016 |
| JP | 2017135365 | A | 8/2017 |
| JP | 2017143261 | A | 8/2017 |
| JP | 2017227892 | A | 12/2017 |
| KR | 20010041543 | A | 5/2001 |
| KR | 20060050931 | A | 5/2006 |
| KR | 20060087446 | A | 8/2006 |
| KR | 20080005548 | A | 1/2008 |
| KR | 20080064830 | A | 7/2008 |
| KR | 20090104770 | A | 10/2009 |
| KR | 20110013362 | A | 2/2011 |
| KR | 20120139802 | A | 12/2012 |
| KR | 20130082110 | A | 7/2013 |
| KR | 101460375 | B1 | 11/2014 |
| KR | 20150060524 | A | 6/2015 |
| KR | 20170017789 | A | 2/2017 |
| KR | 20170074772 | A | 6/2017 |
| KR | 20170143445 | A | 12/2017 |
| TW | 200540573 | A | 12/2005 |
| TW | 200710986 | A | 3/2007 |
| TW | 201011474 | A | 3/2010 |
| TW | 201327659 | A | 7/2013 |
| TW | 201415003 | A | 4/2014 |
| TW | 201433878 | A | 9/2014 |
| TW | 201435621 | A | 9/2014 |
| TW | 201606465 | A | 2/2016 |
| TW | I528201 | B | 4/2016 |
| TW | 201620009 | A | 6/2016 |
| TW | 201633410 | A | 9/2016 |
| TW | 201732459 | A | 9/2017 |
| TW | 201742250 | A | 12/2017 |
| TW | 201802574 | A | 1/2018 |
| TW | 201809856 | A | 3/2018 |
| WO | WO-2004015364 | A1 | 2/2004 |
| WO | WO-2004015727 | A2 | 2/2004 |
| WO | WO-2006104655 | A2 | 10/2006 |
| WO | WO-2013148444 | A1 | 10/2013 |
| WO | WO-2014027354 | A1 | 2/2014 |
| WO | WO-2015027088 | A1 | 2/2015 |
| WO | WO-2016162157 | A1 | 10/2016 |
| WO | WO-2018204193 | A1 | 11/2018 |

OTHER PUBLICATIONS

Byrd, et al., "Approximate Solution of the Trust Region Problem by Minimization over Two-Dimensional Subspaces," Mathematical Programming, vol. 40, pp. 247-263 (1988).

Cazzaniga, F., et al., "TEM sample preparation on photoresist," Instrumentation and Methods, EMC 2008, vol. 1, pp. 653-654. doi:10.1007/978-3-540-85156-1_327.

Chinese First Office Action dated Aug. 16, 2021 issued in Application No. CN 201880044397.0.

Chinese First Office Action dated Dec. 2, 2019 issued in Application No. CN 201611166040.9.

Chinese First Office Action dated Feb. 25, 2019 issued in Application No. CN 201710121052.8.

Chinese First Office Action dated Mar. 11, 2020 issued in Application No. CN 201710475240.0.

Chinese First Office Action dated Mar. 6, 2020 issued in Application No. CN 201710068974.7.

Chinese Second Office Action dated Aug. 10, 2020 issued in Application No. CN 201710475240.0.

Chinese Third Office Action dated Nov. 18, 2020 issued in Application No. CN 201710475240.0.

CN Office Action dated Apr. 26, 2022, in Application No. CN201880044397 with English translation.

CN Office action dated Aug. 16, 2021 in CN Application No. CN201880044397 with English translation.

CN Office action dated Jan. 13, 2022 in CN Application No. CN201880044397 with English translation.

Cooperberg, D.J., et al. (Sep./Oct. 2002) "Semiempirical profile simulation of aluminum etching in a $Cl_2$ / $BCl_3$ plasma," Journal of Vacuum Science & Technology A., 20(5):1536-1556 [doi: http://dx.doi.org/10.1116/1.1494818].

Cramer et al., "High-NA optical CD metrology on small in-cell targets enabling improved higher order dose control and process control for logic," Proceedings of SPIE, 10145, Metrology, Inspection, and Process Control for Microlithography XXXI, 101451B (Mar. 28, 2017).

"SEMulator3D Advanced Modeling," Web page, Coventor, A Lam Research Company, 5 pp. URL: https://www.coventor.com/semiconductor-solutions/semulator3d/semulator3d-advanced-modeling/ (known as of Mar. 2, 2018).

"SEMulator3D," Product Brochure, Coventor, A Lam Research Company, 3 pp. (known as of Mar. 2, 2018) URL:https://www.coventor.com/semiconductor-solutions/semulator3d/.

"SEMulator3D," Web page, Coventor, A Lam Research Company, 5 pp. URL:https://www.coventor.com/semiconductor-solutions/semulator3d/ (known as of Mar. 2, 2018).

European Extended Search Report dated Feb. 10, 2021 issued in EP Application No. EP 18794270.

(56) References Cited

OTHER PUBLICATIONS

Final Office Action dated Nov. 7, 2018 issued in U.S. Appl. No. 15/972,063.
Goodlin et al. (May 2002) "Quantitative Analysis and Comparison of Endpoint Detection Based on Multiple Wavelength Analysis," 201st Meeting of the Electrochemical Society, International Symposium on Plasma Processing XIV, Abs. 415, Philadelphia, PA, 30 pages.
Hoekstra, R. et al. (Jul./Aug. 1997) "Integrated plasma equipment model for polysilicon etch profiles in an inductively coupled plasma reactor with subwafer and superwafer topography," Journal of Vacuum Science & Technology A, 15(4):1913-1921. [doi: http://dx.doi.org/10.1116/1.580659].
Hoekstra, R. et al. (Jul./Aug. 1998) "Microtrenching resulting from specular reflection during chlorine etching of silicon," Journal of Vacuum Science & Technology B, Nanotechnology and Microelectronics, 16(4):2102-2104 [doi: http://dx.doi.org/10.1116/1.590135].
Hoekstra, R. et al. (Nov. 1, 1998) "Comparison of two-dimensional and three-dimensional models for profile simulation of poly-Si etching of finite length trenches," Journal of Vacuum Science & Technology A, 16(6):3274-3280 [doi: http://dx.doi.org/10.1116/1.581533].
Huard, C.M., et al. (Jan. 17, 2017) "Role of neutral transport in aspect ratio dependent plasma etching of three-dimensional features," Journal of Vacuum Science & Technology A., 35(5):05C301-1-05C301-18. [doi: http://dx.doi.org/10.1116/1.4973953].
International Preliminary Report on Patentability dated Nov. 14, 2019 issued in Application No. PCT/US2018/029874.
International Preliminary Report on Patentability dated Oct. 15, 2020 issued in Application No. PCT/US2019/025668.
International Preliminary Report on Patentability dated Oct. 22, 2020 issued in Application No. PCT/US2019/026396.
International Preliminary Report on Patentability dated Oct. 22, 2020 issued in Application No. PCT/US2019/026851.
International Search Report and Written Opinion dated Aug. 10, 2018 issued in Application No. PCT/US2018/029874.
International Search Report and Written Opinion dated Jul. 22, 2019 issued in Application No. PCT/US2019/026396.
International Search Report and Written Opinion dated Jul. 31, 2019 issued in Application No. PCT/US2019/026851.
International Search Report and Written Opinion dated Jul. 5, 2019 issued in Application No. PCT/US2019/025668.
International Search Report and Written Opinion dated Jun. 5, 2020 issued in Application No. PCT/US2020/015464.
Japanese First Office Action dated Feb. 16, 2021 issued in Application No. JP 2017-020050.
Japanese First Office Action dated Mar. 24, 2021 issued in Application No. JP 2017-037874.
JP Office Action dated Oct. 18, 2022, in Application No. 2021-152896 with English translation.
JP Office Action dated Jun. 14, 2022 in Application No. JP20190559822.
KR Office Action dated Apr. 15, 2022, in application No. KR1020170026906 with English Translation.
KR Office Action dated Dec. 16, 2022, in Application No. KR10-2019-7035372 with English translation.
KR Office Action dated May 16, 2022, in Application No. KR1020170077116 with English translation.
KR Office Action dated Oct. 19, 2021, in application No. KR10-2017-0077116 with English Translation.
KR Office Action dated Oct. 22, 2021, in application No. KR10-2017-0026906 with English Translation.
Kushner, M.J., (Sep. 18, 2009) "Hybrid modelling of low temperature plasmas for fundamental investigations and equipment design," Journal of Physics D., 42(1904013):1-20 [doi: 10.1088/0022-3727/42/19/194013].
Lorusso et al. (2012) "Model calibration and validation for pre-production EUVL," Proc. of SPIE, 8322:83221L-1-83221L-11.
Lynn et al. (2009) "Virtual Metrology for Plasma Etch using Tool Variables," IEEE, pp. 143-148.
Lynn, Shane (Apr. 2011) "Virtual Metrology for Plasma Etch Processes," A thesis submitted in partial fulfillment for the degree of Doctor of Philosophy in the Faculty of Science and Engineering, Electronic Engineering Department, National University of Ireland, Maynooth, 361 pages.
Moharam et al. (Jul. 1981) "Rigorous coupled-wave analysis of planar-grating diffraction," J. Opt. Soc. Am., 71(7):811-818.
More, J.J. and D.C. Sorensen, "Computing a Trust Region Step," SIAM Journal on Scientific and Statistical Computing, vol. 3, pp. 553-572, (1983).
More, J.J., "The Levenberg-Marquardt Algorithm: Implementation and Theory," Numerical Analysis, ed. G. A Watson, Lecture Notes in Mathematics 630, Springer Verlag, pp. 105-116 (1977).
Notice of Allowance dated Feb. 1, 2019 issued in U.S. Appl. No. 15/972,063.
Notice of Allowance dated Jan. 11, 2018 issued in U.S. Appl. No. 15/059,073.
Oberschmidt et al. (2010) "Automation of Sample Plan Creation for Process Model Calibration," Proc. of SPIE, 7640:76401G-1-76401G-9 [Downloaded on Sep. 18, 2013 from http://proceedings.spiedigitallibrary.org/].
Office Action dated Jun. 14, 2018 issued in U.S. Appl. No. 15/972,063.
Ohashi, T., et al., "Photoresist cross-sectional shape change caused by scanning electron microscope-induced shrinkage," Journal of Micro/Nanolithography, MEMS, and MOEMS, vol. 14, No. 3, Jul. 9, 2015, pp. 034001-1-034001-8.
Powell, M.J.D., "A Fast Algorithm for Nonlinearly Constrained Optimization Calculations," Numerical Analysis, GA. Watson ed., Lecture Notes in Mathematics, Springer, Berlin, Heidelberg, vol. 630 (1978).
Radjenović et al. (2007) "3D Etching profile evolution simulations: Time dependence analysis of the profile charging during SiO2 etching in plasma," 5th EU—Japan Joint Symposium on Plasma Process, Journal of Physics: Conference Series, 86:13 pages.
Ringwood et al. (Feb. 2010) "Estimation and Control in Semiconductor Etch: Practice and Possibilities," IEEE Transactions on Semiconductor Manufacturing, 23(1):87-98.
Sankaran, A. et al. (Jan. 15, 2005) "Etching of porous and solid $SiO_2$ in Ar/c—$C_4F_8$, $O_2$/C—$C_4F_8$ and Ar/$O_2$/c—$C_4F_8$ plasmas," Journal of Applied Physics, 97(2):023307-1-023307-10. [doi: http://dx.doi.org/10.1063/1.1834979] [retrieved on Jan. 29, 2005].
Sankaran, A. et al. (Jul./Aug. 2004) "Integrated feature scale modeling of plasma processing of porous and solid $SiO_2$. I. Fluorocarbon etching," Journal of Vacuum Science & Technology A., 22(4):1242-1259 [doi: http://dx.doi.org/10.1116/1.1764821].
Sebastian, E., et al., "Advanced Coating Techniques for Photoresist TEM Sample Preparation," 2016 IEEE 23rd International Symposium on the Physical and Failure Analysis of Integrated Circuits (IPFA), pp. 113-115.
Singapore Notice of Eligibility for Grant and Supplemental Examination Report dated Jun. 22, 2020 issued in Application No. SG 10201705049V.
Sun et al. (2011) "Optimizing OPC data sampling based on "orthogonal vector space"," Proc. of SPIE, 7973:79732K-1-79732K-10.
Taiwanese First Office Action dated Dec. 10, 2020 issued in Application No. TW 106120279.
Taiwanese First Office Action dated Dec. 7, 2020 issued in Application No. TW 106106609.
Taiwanese Notice of Allowance dated Jul. 17, 2020 issued in Application No. TW 106103883.
Tawfic et al. (2007) "Feedback Flow to improve Model Based OPC Calibration Test Pattern," Proc. of SPIE, 6521:65211J-1-65211J-9.
TW Office Action dated Aug. 17, 2022, in Application No. TW108112113 With English Translation.
TW Office Action dated Jan. 10, 2023 in Application No. TW108112271 with English translation.
TW Office Action dated Jan. 19, 2023, in Application No. TW108112113 with English translation.
TW Office Action dated Mar. 22, 2022, in Application No. TW107114630 with English translation.
TW Office Action dated Sep. 7, 2022, in Application No. TW108112271 with English translation.

(56) References Cited

OTHER PUBLICATIONS

U.S. Appl. No. 14/972,969 , inventors Tetiker et al.., filed on Dec. 17, 2015.
U.S. Appl. No. 15/018,708 , inventors Tetiker et al.., filed on Feb. 8, 2016.
U.S. Appl. No. 15/059,073 , inventors Bailey et al.., filed on Mar. 2, 2016.
U.S. Appl. No. 15/188,910 , inventors Sriraman et al.., filed on Jun. 21, 2016.
U.S. Appl. No. 15/367,060 , inventors Mailfert et al.., filed on Dec. 1, 2016.
U.S. Appl. No. 15/583,610 , inventors Tetiker et al.., filed on May 1, 2017.
U.S. Appl. No. 15/698,458 , inventors Tetiker et al.., filed on Sep. 7, 2017.
U.S. Appl. No. 15/946,940 , inventors Feng et al.., filed on Apr. 6, 2018.
U.S. Appl. No. 15/972,063 , inventors Tetiker et al.., filed on May 4, 2018.
U.S. Appl. No. 16/224,651 , inventors Sriraman et al.., filed on Dec. 18, 2018.
U.S. Appl. No. 16/260,870 , inventors Bowes et al.., filed on Feb. 14, 2019.
U.S. Appl. No. 16/741,735 , inventors Feng et al., filed on Jan. 13, 2020.
U.S. Final Office Action, dated Aug. 27, 2018, issued in U.S. Appl. No. 14/972,969.
US Final Office Action dated Aug. 27, 2020 issued in U.S. Appl. No. 16/260,870.
US Final Office Action dated Aug. 29, 2019 issued in U.S. Appl. No. 16/015,096.
U.S. Final office Action dated Jun. 17, 2022 in U.S. Appl. No. 17/045,168.
U.S. Final Office Action, dated May 23, 2018 issued in U.S. Appl. No. 15/188,910.
U.S. Non-Final office Action dated Sep. 9, 2022 in U.S. Appl. No. 17/301,345.
U.S. Notice of Allowance, dated Apr. 5, 2019, issued in U.S. Appl. No. 14/972,969.
US Notice of Allowance dated Dec. 9, 2020 issued in U.S. Appl. No. 16/260,870.
U.S. Notice of Allowance dated Feb. 15, 2023 in U.S. Appl. No. 17/301,345.
U.S. Notice of Allowance, dated Feb. 6, 2018 issued in U.S. Appl. No. 15/698,458.
U.S. Notice of Allowance dated Jan. 13, 2021 issued in U.S. Appl. No. 16/741,735.
U.S. Notice of Allowance, dated Jul. 23, 2019 issued in U.S. Appl. No. 15/583,610.
U.S. Notice of Allowance, dated Jun. 7, 2017, issued in U.S. Appl. No. 15/018,708.
U.S. Notice of Allowance, dated Nov. 26, 2018 issued in U.S. Appl. No. 15/367,060.
U.S. Notice of Allowance dated Nov. 30, 2022 in U.S. Appl. No. 17/045,168.
U.S. Notice of Allowance dated Oct. 16, 2019 issued in U.S. Appl. No. 15/946,940.
U.S. Notice of Allowance, dated Oct. 30, 2019 issued in U.S. Appl. No. 16/224,651.
U.S. Notice of Allowance, dated Sep. 27, 2018 issued in U.S. Appl. No. 15/188,910.
U.S. Office Action, dated Aug. 10, 2017, issued in U.S. Appl. No. 15/059,073.
U.S. Office Action, dated Dec. 7, 2017, issued in U.S. Appl. No. 15/188,910.
US Office Action dated Feb. 22, 2022 issued in U.S. Appl. No. 17/045,168.
U.S. Office Action, dated Jan. 10, 2019, issued in U.S. Appl. No. 14/972,969.
U.S. Office Action, dated Jan. 25, 2018, issued in U.S. Appl. No. 14/972,969.
U.S. Office Action dated Jul. 10, 2019 issued in U.S. Appl. No. 15/946,940.
U.S. Office Action, dated Jul. 10, 2019 issued in U.S. Appl. No. 16/224,651.
U.S. Office Action, dated Jul. 11, 2018 issued in U.S. Appl. No. 15/367,060.
US Office Action dated Mar. 17, 2020 issued in U.S. Appl. No. 16/260,870.
US Office Action, dated Mar. 22, 2017, issued in U.S. Appl. No. 15/018,708.
U.S. Office Action, dated Mar. 4, 2019 issued in U.S. Appl. No. 15/673,321.
US Office Action dated Mar. 6, 2019 issued in U.S. Appl. No. 16/015,096.
U.S. Office Action, dated Oct. 2, 2017, issued in U.S. Appl. No. 15/698,458.
U.S. Office Action dated Oct. 8, 2020 issued in U.S. Appl. No. 16/741,735.
Yue et al. (Jan./Feb. 2001) "Plasma etching endpoint detection using multiple wavelengths for small open-area wafers," J. Vac. Sci. Technol. A, 19(1):66-75.
Zeng (2012) "Statistical Methods for Enhanced Metrology in Semiconductor/Photovoltaic Manufacturing," A dissertation submitted in partial satisfaction of the requirements for the degree of Doctor of Philosophy in Engineering—Electrical Engineering and Computer Sciences in the Graduate Division of the University of California, Berkeley, 171 pages.
Zhang, D. et al. (Mar./Apr. 2001) "Investigations of surface reactions during $C_2F6$ plasma etching of $SiO_2$ with equipment and feature scale models," Journal of Vacuum Science & Technology A, 19(2):524-538 [doi: http://dx.doi.org/10.1116/1.1349728].
Zhang, Y., (Sep. 30, 2015) Doctoral Dissertation of "Low Temperature Plasma Etching Control through Ion Energy Angular Distribution and 3-Dimensional Profile Simulation," Dept. of Electrical Engineering at the University of Michigan, pp. 49-71, Appendix B. pp. 243-248 [doi: http://hdl.handle.net/2027.42/113432].
CN Notice of Allowance dated Jul. 19, 2024 in CN Application No. 202011262730.0 with English translation.
CN Notice of Allowances dated Jul. 9, 2024 in CN Application No. 202080011487.7 with English translation.
CN Office Action dated Aug. 1, 2024 in CN Application No. 201980025007.X with English translation.
CN Office Action dated Dec. 8, 2023 in CN Application No. 201980025007.X with English Translation.
CN Office Action dated Dec. 28, 2023 in CN Application No. 202011262730, with English Translation.
CN Office Action dated Jun. 12, 2024 in CN Application No. 201980027462.3, with English Translation.
CN Office Action dated May 6, 2024 in CN Application No. 202110532314.6, with English Translation.
EP Office Action dated Jan. 3, 2025 in EP Application No. 18794270.1.
JP Office Action dated Apr. 2, 2024 in JP Application No. 2021-544115, with English Translation.
KR Decision to Grant and Search Report dated Feb. 26, 2025 in KR Application No. 10-2020-7032376, with English translation.
KR Notice of Allowances dated Nov. 27, 2024 in KR Application No. 10-2017-0017259 with English Translation.
KR Notice of Allowances dated Oct. 24, 2024 in KR Application No. 10-2020-7032077 with English Translation.
KR Office Action dated Apr. 21, 2024 in KR Application No. 10-2017-0017259 with English translation.
KR Office Action dated Aug. 20, 2024 in KR Application No. 10-2021-7027192, with English Translation.
KR Office Action dated Dec. 15, 2023 in KR Application No. 10-2020-7032501 with English Translation.
KR Office Action dated Dec. 29, 2022 in Application No. KR10-2022-0086361 with English translation.
KR Office Action dated Jan. 19, 2026 in KR Application No. 10-2025-7016518, with English Translation.

(56) References Cited

OTHER PUBLICATIONS

KR Office Action dated Jan. 31, 2024 in KR Application No. 10-2020-7032077, with English Translation.
KR Office Action dated Jul. 31, 2024 in KR Application No. 10-2020-7032501 with English translation.
KR Office Action dated May 22, 2024 in KR Application No. 10-2020-7032376 with English translation.
Qiu M., et al., "Numerical Study on Effect of Silicon Texture Structure on Reflectance of Light," Acta Optic Sinica, 2008, vol. 28 (12), pp. 2394-2399.
TW Office Action dated Aug. 10, 2023, in application No. TW108112271 with English Translation.
TW Office Action dated May 23, 2023, in Application No. TW109102831 with English translation.
TW Office Action dated May 30, 2023 in Application No. TW108112113 with English translation.
U.S. Corrected Notice of Allowance dated Feb. 1, 2024 in U.S. Appl. No. 15/733,728.
U.S. Corrected Notice of Allowance dated Jun. 12, 2023, in U.S. Appl. No. 17/301,345.
U.S. Non-Final Office Action dated Jul. 20, 2023, in U.S. Appl. No. 15/733,728.
U.S. Notice of Allowance dated Oct. 30, 2023, in U.S. Appl. No. 15/733,728.
Xu X., "A Machine Learning Based Framework for Sub-Resolution Assist Feature Generation, "2016, ACM, pp. 161-168.
KR Office Action dated May 21, 2026 in KR Application No. 10-2025-7002038, with English Translation.

* cited by examiner

RESIST AND ETCH MODELING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

The performance of semiconductor device fabrication operations such as plasma-assisted etch processes is often essential to the success of a semiconductor device processing workflow. However, optimization or tuning of the etch processes and/or the tools associated with them (e.g., etch reactors, lithography masks, etc.) may prove technically difficult and time-consuming, often involving skilled personnel manually adjusting etch process parameters or tool component designs to generate the desired target feature profile. While some progress has been made in developing automated procedures to determine mask designs and process parameters responsible for a desired etch profile, much works remains to be done.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Certain aspects of this disclosure pertain to methods of generating a transfer function that relates segments on lithography photomasks to features produced by photolithography and etching using such segments. In some embodiments, the methods may be characterized by the following operations: (a) receiving a set of design layout segments; (b) determining resist feature profiles from a computational resist model to which is provided the set of design layout segments as inputs; (c) determining etch feature profiles from a computational etch model to which is provided the resist feature profiles as inputs; and (d) generating the transfer function using the set of design layout segments and corresponding etch feature profiles. Some of the methods additionally include applying an inverse of the transfer function to determine a design layout for a lithography mask.

In certain embodiments, the design layout segments are clips or gauges provided in a GDS format. In certain embodiments, the resist feature profiles and/or the etch feature profiles are provided in three dimensions.

In certain embodiments, the methods additionally include optimizing the computational resist model by using metrology results of wafers on which photolithography was performed using one or more clips form a design clip library. In some such embodiments, optimizing the computational resist model is performed prior to (b). In certain embodiments, the methods additionally include optimizing the computational etch model by using metrology results of wafers on which photolithography and etching were performed using one or more clips form a design clip library. In some such embodiments, optimizing the computational etch model is performed prior to (c).

In some cases, the methods additionally include the following operations: (e) running the computational etch model multiple times, each time with a different set of process conditions, and (f) from outputs of the computational etch model produced during (e), identifying a selected set of process conditions for use during operation of an etch chamber.

Certain aspects of this disclosure pertain to computer program products that include a non-transitory computer readable medium on which is provided computer executable instructions for causing a computational system to generating a transfer function that relates segments on lithography photomasks to features produced by photolithography and etching using the segments. The computer executable instructions may include instructions for: (a) receiving a set of design layout segments; (b) determining resist feature profiles from a computational resist model to which is provided the set of design layout segments as inputs; (c) determining etch feature profiles from a computational etch model to which is provided the resist feature profiles as inputs; and (d) generating the transfer function using the set of design layout segments and corresponding etch feature profiles. In certain implementations, the computer executable instructions additionally include instructions for applying an inverse of the transfer function to determine a design layout for a lithography mask.

For some computer program products, the design layout segments are clips or gauges provided in a GDS format. For some computer program products, the resist feature profiles and/or the etch feature profiles are provided in three dimensions.

In certain implementations, the computer executable instructions additionally include instructions for optimizing the computational resist model by using metrology results of wafers on which photolithography was performed using one or more clips form a design clip library. As an example, the instructions for optimizing the computational resist model may be arranged to be executed prior to the instructions for (b). In certain implementations, the computer executable instructions additionally include instructions for optimizing the computational etch model by using metrology results of wafers on which photolithography and etching were performed using one or more clips form a design clip library. As an example, the instructions for optimizing the computational etch model may be arranged to be executed prior to the instructions in (c).

In certain implementations, the computer executable instructions additionally include instructions for: (e) running the computational etch model multiple times, each time with a different set of process conditions, and (f) from outputs of the computational etch model produced during (e), identifying a selected set of process conditions for use during operation of an etch chamber.

A further aspect of this disclosure pertains to methods of generating a transfer function that relates segments on lithography photomasks to features produced by photolithography and etching using said segments. Such methods may be characterized by the following elements: (a) receiving after development inspection metrology results produced from one or more first test substrates on which resist was applied and patterned using a set of design layout segments; (b) receiving after etch inspection metrology results produced from one or more second test substrates which were etched after resist was applied and patterned using said set of design layout segments; and (c) generating the transfer function using the set of design layout segments together with corresponding after development inspection metrology results and corresponding after etch inspection metrology results. In certain embodiments, generating the transfer function involves running the computational resist model multiple times to provide a set of predicted after development resist profiles.

In some cases, the methods additionally include calibrating a computational resist model using the after development inspection metrology results. In some cases, the methods additionally include calibrating a computational etch model using the after etch inspection metrology results. In some examples, generating the transfer function involves running the computational etch model multiple times to provide a set of predicted etch feature profiles.

In certain embodiments, the after development inspection metrology results and/or the after etch inspection metrology results are provided in three dimensions. In certain embodiments, the after development inspection metrology results and/or the after etch inspection metrology results are provided as x-y contours using CD-SEM. In certain embodiments, the after development inspection metrology results and/or the after etch inspection metrology results are provided as x-z profiles using a TEM or CD-SAXS technique.

In certain embodiments, the set of design layout segments includes clips or gauges provided in a GDS format. In some cases, the methods additionally include applying an inverse of the transfer function to determine a design layout for a lithography mask.

Certain other aspects of this disclosure pertain to computer program products that include a non-transitory computer readable medium on which is provided computer executable instructions for causing a computational system to generating a transfer function that relates segments on lithography photomasks to features produced by photolithography and etching using the segments. The computer executable instructions may include instructions for: (a) receiving after development inspection metrology results produced from one or more first test substrates on which resist was applied and patterned using a set of design layout segments; (b) receiving after etch inspection metrology results produced from one or more second test substrates which were etched after resist was applied and patterned using said set of design layout segments; and (c) generating the transfer function using the set of design layout segments together with corresponding after development inspection metrology results and corresponding after etch inspection metrology results. In certain implementations, the computer executable instructions additionally include instructions for applying an inverse of the transfer function to determine a design layout for a lithography mask.

In certain implementations, the computer executable instructions additionally include instructions for calibrating a computational resist model using the after development inspection metrology results. In some examples, the instructions for generating the transfer function include instructions for running the computational resist model multiple times to provide a set of predicted after development resist profiles. In certain implementations, the computer executable instructions additionally include instructions for calibrating a computational etch model using the after etch inspection metrology results. In some examples, the instructions for generating the transfer function include instructions running the computational etch model multiple times to provide a set of predicted etch feature profiles.

For some computer program products, the after development inspection metrology results and/or the after etch inspection metrology results are provided in three dimensions. For some computer program products, the after development inspection metrology results and/or the after etch inspection metrology results are provided as x-y contours of CD-SEM-generated images. For some computer program products, the after development inspection metrology results and/or the after etch inspection metrology results are provided as x-z profiles of IEM or CD-SAXS-generated images. For some computer program products, the set of design layout segments includes clips or gauges provided in a GDS format.

These and other features of the disclosure will be presented in more detail below with reference to the associated drawings.

DETAILED DESCRIPTION

Process and Modules

Figure 1:
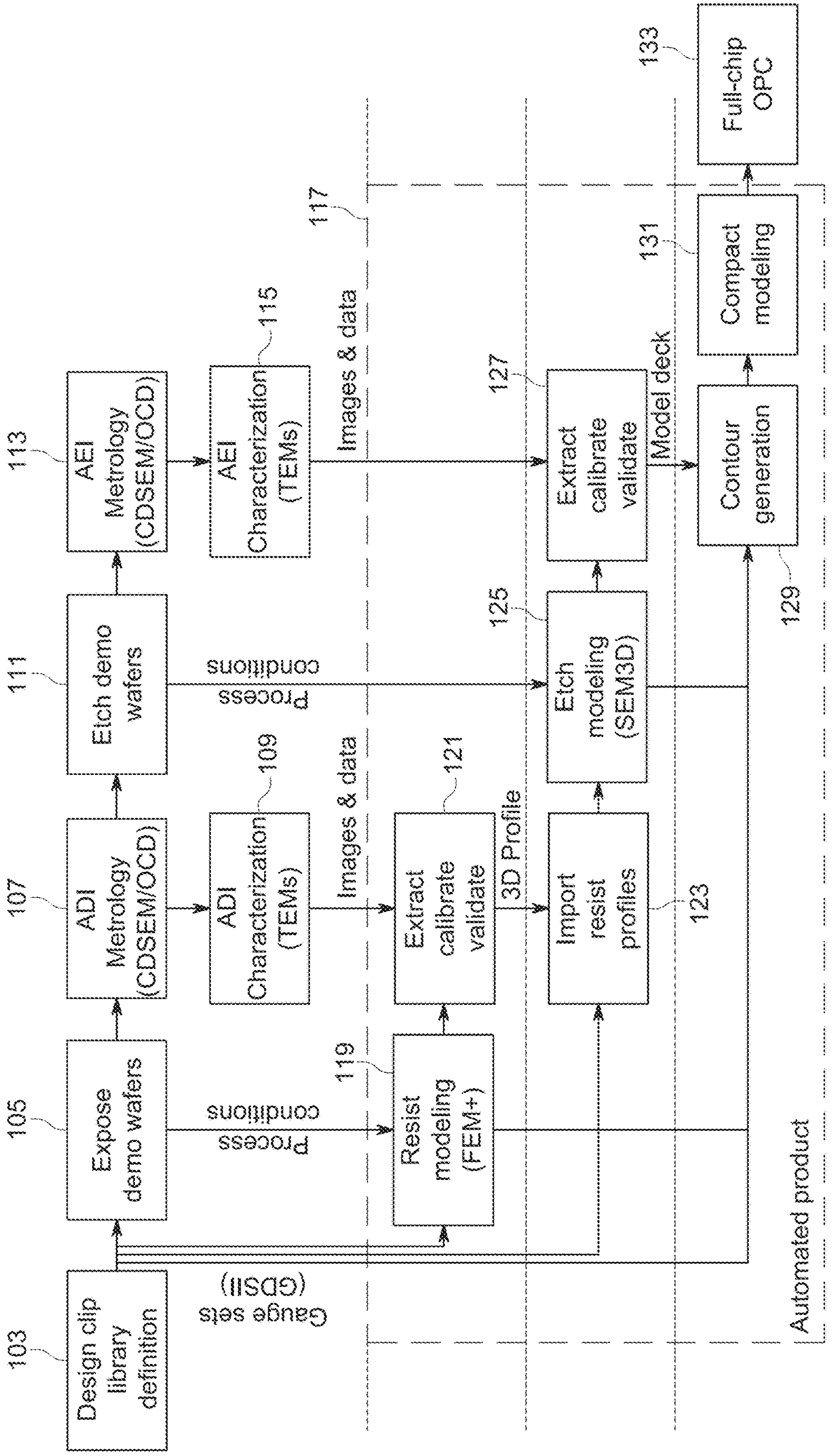
FIG. 1 is a system diagram depicting various operations (primarily metrology operations) and logic modules (typically implemented in software) for optimizing a resist model and an etch model and for generating a transfer function useful in converting between patterns (and segments comprising such patterns) on a lithographic photomask and contours produced by transferring such patterns onto resists and subsequently etching the substrate underneath the resist patterns.

FIG. 1 provides an example system and associated methodology for generating a transfer function or a tool that uses such function in proximity correction to account for both photolithography and some other semiconductor device fabrication operation such as an etch operation. The other semiconductor device fabrication operation is performed on a substrate having a patterned photoresist (or a mask pattern produced therefrom) to selectively etch or otherwise process regions of substrate. The profile of an etched feature, for example, is strongly dependent on the profile of the resist features forming a mask for the etch process. See, for example, the resist and etch profiles in FIG. 5B. Further, it has been found that the predictive capability of an etch model (as well as the physical etch process itself) is strongly influenced the profiles of after-development resist features provided as inputs to the etch model.

To generate an appropriate transfer function, the system may have to calibrate or optimize a resist model and/or a device fabrication operation model (e.g., an etch model). While the description herein uses etch as an example of the device fabrication operation and associated model, this disclosure extends to other device fabrication operations such as epitaxial growth, selective deposition, and the like. Further, while the description focuses on resist development to produce a surface pattern, the disclosure also extends to other pattern generating techniques. Generally, the disclosure pertains to co-optimization of two or more sequential semiconductor device fabrication operations. In various embodiments, a transfer function accounting for the propagation of a pattern across two or more successive fabrication operations is generated.

In FIG. 1, certain physical operations and metrology are performed on one or more demo wafers. These operations are depicted toward the upper portion of the figure. Various processing or software operations are performed on a combination of (i) gauges or clips from a library and (ii) data generated from the metrology. The software/processing operations are represented as modules toward the lower portion of the figure.

In certain embodiments, the system and methodology illustrated in FIG. 1 is used to design lithography photomasks for one or more semiconductor device fabrication operations used in production of integrated circuit chips. Other applications include designing improved photolithography conditions and/or improved process windows for device fabrication operations such as etch processes. Still other applications include designing improved photolithography apparatus and/or improved device fabrication equipment such as etchers.

Design Clip Library Definition

Figure 3A:
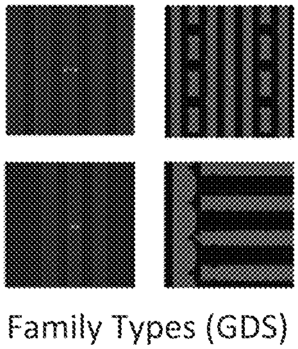
FIG. 3A illustrates families of gauges that may be employed in a design clip library or otherwise used in (i) optimizing a process simulation model (e.g., a resist model or an etch model) and/or (ii) generating a proximity correction transfer function.
Figure 3B:
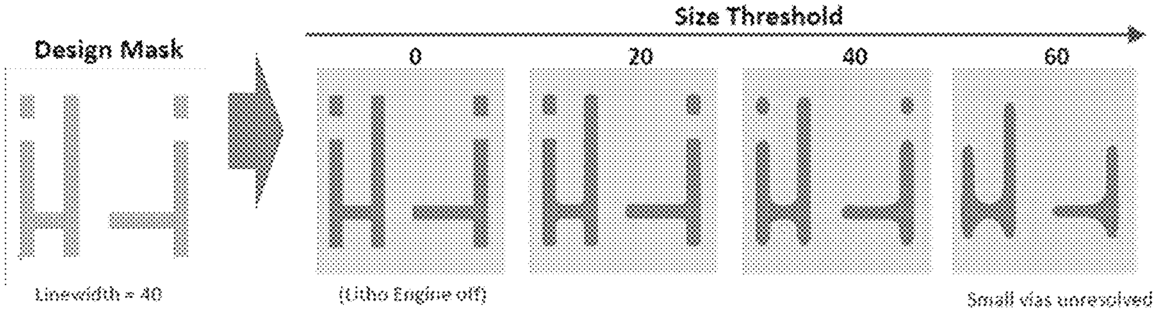
FIG. 3B illustrates a clip of gauge (left panel) and a series of associated contours produced by lithography, or by a resist model of the lithography process, at different feature sizes.

In FIG. 1, the design clip library is defined at an operation 103. Clips or gauges are geometric features or segments that may represent small portions of a design layout. While a full-chip layout has all segments of a layer of an entire integrated circuit, a clip or gauge is a small discrete segment that might appear repeatedly throughout a full-chip layout. Examples of clips or gauges are small polygonal structures such as L-shaped structures, E-shaped structures, and the like. FIG. 3A presents an example of families of gauges and the left panel of FIG. 3B presents an example of a gauge. A design clip library is a collection of different clips or gauges that collectively represent a range of different segments that typically occur in a full-chip design layout or are selected for some different purpose.

In certain embodiments, a design clip library definition includes segments useful for one or more of the following functions: (1) optimizing a resist model, (2) optimizing an etch model, and (3) producing a collection of segments and associated contours for generating a transfer function accounting for both photolithography and etch variations.

A design clip library may include clips that anticipate a range of segment geometries that may occur in one or more photomasks for one or more integrated circuit chips. Generally, these segments will be expected to be present in photomasks for processes that employ the photolithography conditions and etch conditions for a given fabrication operation. Ultimately, the resulting library can be re-used for other processes covering the same or similar conditions and mask geometries.

Expose Demo Wafers

One or more demo wafers are provided to generate experimental results that can be used to calibrate or optimize a resist model and/or an etch model for a production process. The demo wafers may be first coated with a resist, typically as used in production, and then exposed to radiation patterns, e.g., through a lithography photomask or by an electron beam. See operation 105. The lithography photomask is patterned with certain of the segments that make up the design clip library from operation 103. The photolithography process conditions, e.g., focus and exposure, are recorded or otherwise made available for subsequent computational operations such as optimization or tuning of a resist model. While this disclosure describes lithography and resist exposure in terms of photolithography, the concepts are directly transferrable to electron beam lithography and other types of resist exposure for defining patterns in semiconductor device fabrication operations.

After the one or more demo wafers are exposed in 105, they are developed under conditions (sometimes referred to as a lithography process window) expected to be used in the production process. As understood in the art, exposed photoresist on the demo wafer(s) is chemically converted to allow selective removal of either the portions of the photoresist exposed to radiation (e.g., UV light or an electron beam) or the portions not exposed to radiation. A developed photoresist exists after removal of the exposed or unexposed portions.

The term "demo wafer" should be interpreted to include any non-production wafer or other substrate having features suitable for testing with, e.g., metrology. A coupon, which may be a small portion of a wafer is an example of a demo wafer. In addition to coupons and other non-standard format substrates with features, demo wafers may be standard size wafers such as 200 mm wafers, 300 mm wafers, and 450 mm wafers.

ADI Metrology and Characterization

Figure 5A:
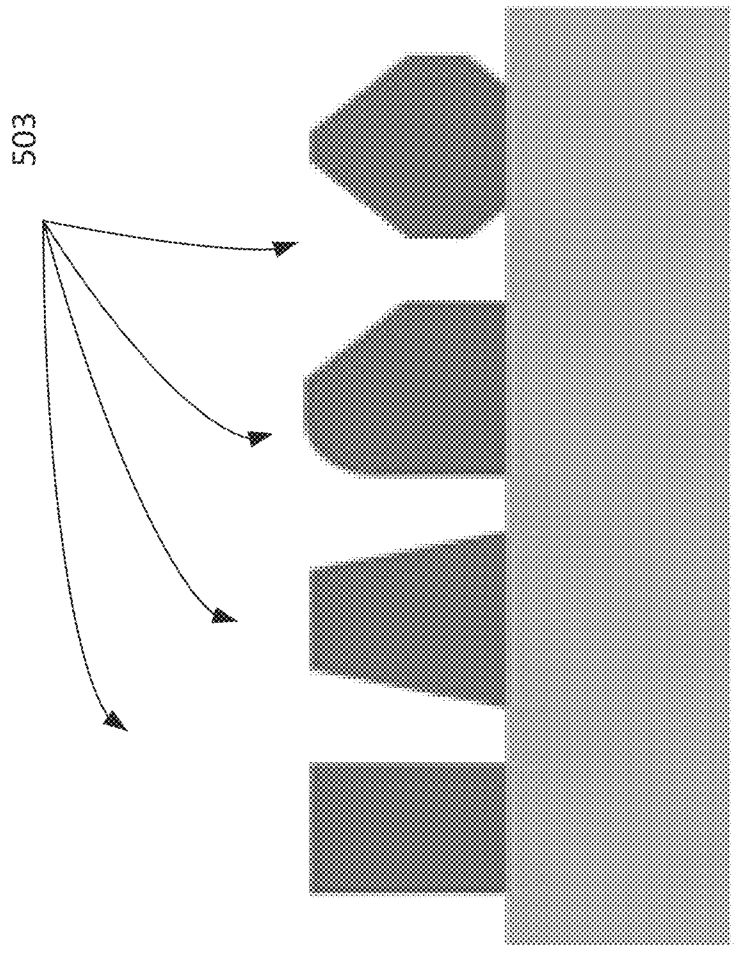
FIGS. 5A and 5B present examples of x-z profiles for features of developed resists. A variety of resist feature profiles are illustrated in FIG. 5A.
Figure 5B:
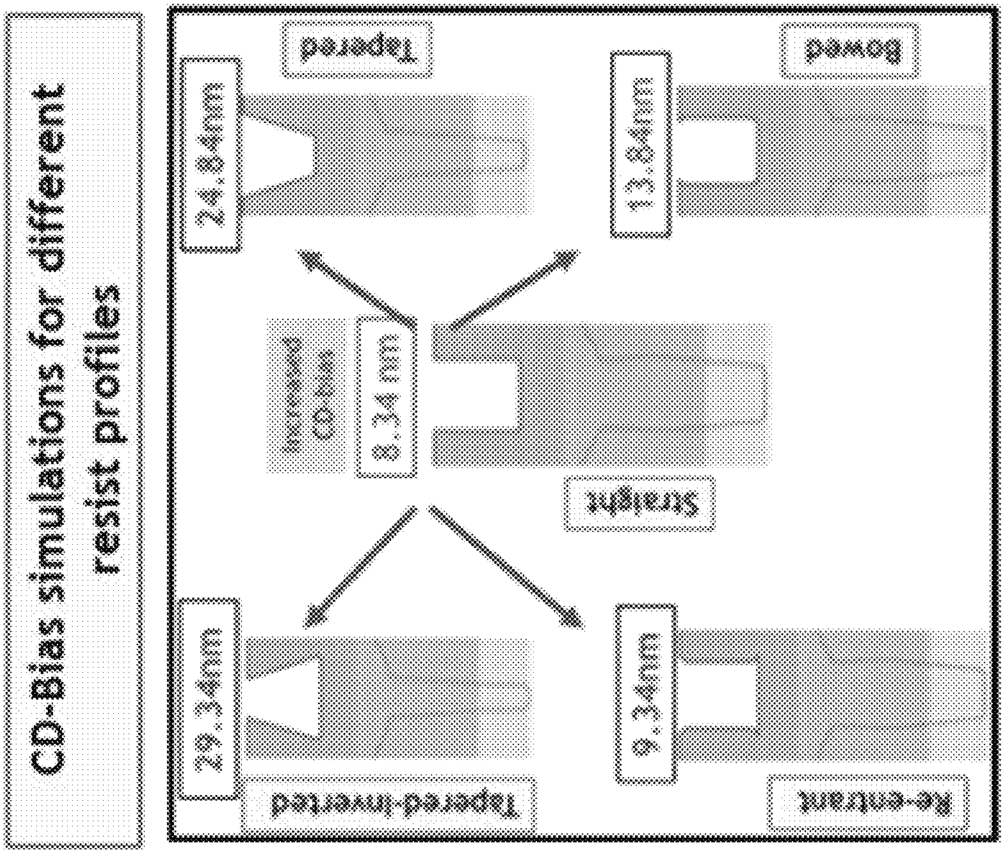

As illustrated in FIG. 1, the one or more exposed demo wafers are subjected to after-development inspection (ADI) metrology and characterization. See operations 107 and 109. Examples of ADI metrology include critical dimension scanning electron microscopy (CDSEM) and optical critical dimension (OCD) metrology. Other examples include transmission electron microscopy (TEM) and critical dimension small angle X-ray scattering (CDSAXS). These metrologies may be conducted in the x-y plane, which is viewed top down onto the wafer and/or from the vantage of the mask, or in the x-z plane, which is viewed as a cross-section of a wafer feature showing its aspect ratio and feature profile. Example x-z profiles for features of a developed resist are illustrated in FIGS. 5A and 5B. A variety of resist feature profiles 503 are illustrated in FIG. 5A. In certain embodiments, one or more metrologies are selected in order to collect information in all three dimensions.

Figure 4:
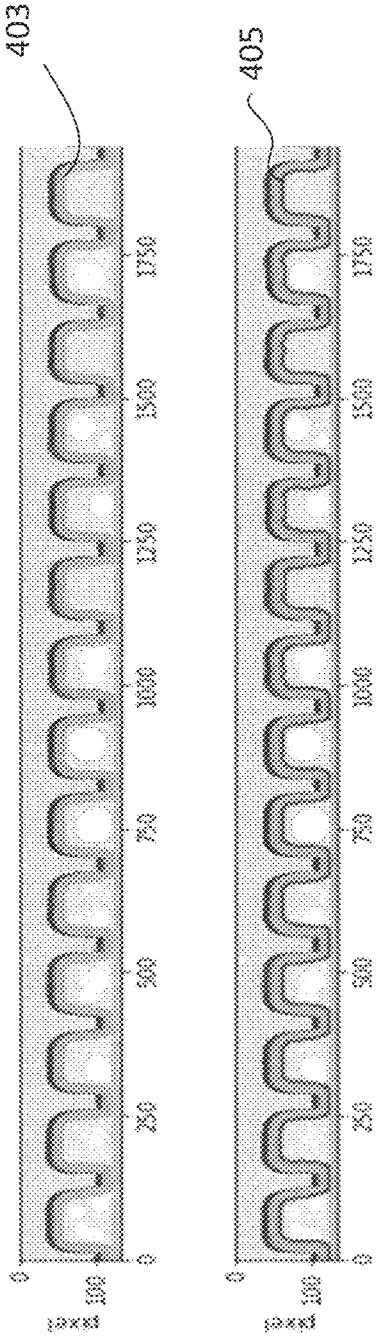
FIG. 4 shows an x-z plane TEM micrograph of developed resist coated with a conformal layer of material (dark gray layer on top of light gray resist features).

In certain embodiments, a developed photoresist is first coated with a material that does not significantly change the dimensions of features in the photoresist and allows TEM or other metrology to capture the features. FIG. 4 shows an x-z plane TEM micrograph of a developed resist profile coated with a conformal layer of material (dark gray layer on top of light gray resist features). The profile of the developed resist is shown as profile 403 (highlighted line following the interface of the dark gray material and light gray resist). A software routine may be configured to define profile 403 from a cross-sectional micrograph of developed resist coated with a conformal layer. In certain embodiments, developed resists are conformally coated with an oxide or nitride material prior to imaging. An example of such oxide or nitride material and its imaging is described in U.S. patent application Ser. No. 16/015,096, titled "Protective Coating on Photoresist for Photoresist Metrology," filed Jun. 21, 2018, which is incorporated herein by reference in its entirety.

The direct output of operation 109 is images and/or data characterizing the two-dimensional (x-y and/or x-z) and/or three-dimensional profiles of developed features in the photoresist of the one or more demo wafers. A goal of operations 107 and 109 is to provide profiles (e.g., two-dimensional contours in two perpendicular planes or a full three-dimensional representation) of developed features in the photoresist that correspond to the clips in the design clip library. In other words, the metrology and characterization provides information on a one-to-one correspondence between segments on a lithography photomask (that typically directly match the geometries of the clips or gauges in the library) and the profiles of photoresist features produced by exposure and development using the segments on the lithography photomask. With this information, a resist model that predicts photoresist profiles produced using lithography photomask segments can be calibrated or optimized. In addition or alternatively, x-y resist pattern contours or full three dimensional representations obtained by metrology can be used in developing a transfer function, as described more fully below.

Note that the lithography conditions may vary from layer-to-layer during fabrication of an integrated circuit chip. Therefore, the demo wafers may be exposed to a different lithography conditions to provide various examples for optimizing a resist model and/or generating a transfer function. Of course ADI metrology and characterization are performed for each experiment, collectively spanning a range of mask segments and/or lithography process conditions.

Etch Demo Wafers

One or more demo wafers developed using a lithography photomask having segments corresponding to the clips or gauges in the design clip library are etched. See operation 111. The etch conditions are those to be used in a production process (or at least they mimic the feature profiles produced using the production process). These etched demo wafers may be the same or different from the demo wafers that were used for ADI metrology in operation 109. Note that the ADI metrology process in operation 107 may render a photoresist unsuitable for use in a subsequent etch process, in which case fresh demo wafers exposed as operation 105 but not subjected to ADI metrology are used in etch operation 111.

The etch conditions are sometimes referred to, collectively, as a process window and they may be defined by various chemical and/or physical parameters such as an etch reactor's pressure, pedestal temperature, plasma generation conditions, process gas conditions (composition, flow rates, partial pressures, etc.), and the like. These etch process conditions are recorded and made available for subsequent computational operations such as optimization or tuning of an etch model.

The demo wafers may be made from a material or stack of materials that is etched, or behaves in the manner as the material or stack, to be etched by a production process. In this manner, the experimental etch results provide an accurate representation of the etch process to be modelled.

AEI Metrology and Characterization

The one or more etched demo wafers (from operation 111) are subjected to after-etch inspection (AEI) metrology and characterization. See operations 113 and 115. Examples of AEI metrology include critical dimension scanning electron microscopy (CDSEM) and optical critical dimension (OCD) metrology. Other examples include transmission electron microscopy (TEM). As with ADI metrology and characterization, any of these metrologies may be conducted in the x-y plane or in the x-z plane. In certain embodiments, one or more metrologies are selected in order to collect information in all three dimensions.

The direct output of operation 115 is images and/or data characterizing the two-dimensional (x-y and/or x-z) and/or three-dimensional profiles of features etched in the one or more demo wafers. A goal of these operations 113 and 115 is to provide profiles (e.g., two-dimensional contours in two perpendicular planes or a full three-dimensional representation) of etched features in the material or stack of materials in etched in the demo wafer. These etched features correspond to the clips in the design clip library. In other words, the metrology and characterization provides information on a one-to-one correspondence between segments on a lithography photomask (that typically directly match the geometries of the clips or gauges in the library) and the profiles of etched features produced by etching patterns produced using the segments on the lithography photomask. With this information, an etch model that predicts etch profiles produced using lithography photomask segments can be calibrated or optimized. In addition or alternatively, x-y contours of etched features obtained by metrology can be used in developing a transfer function, as described more fully below.

Figure 5C:
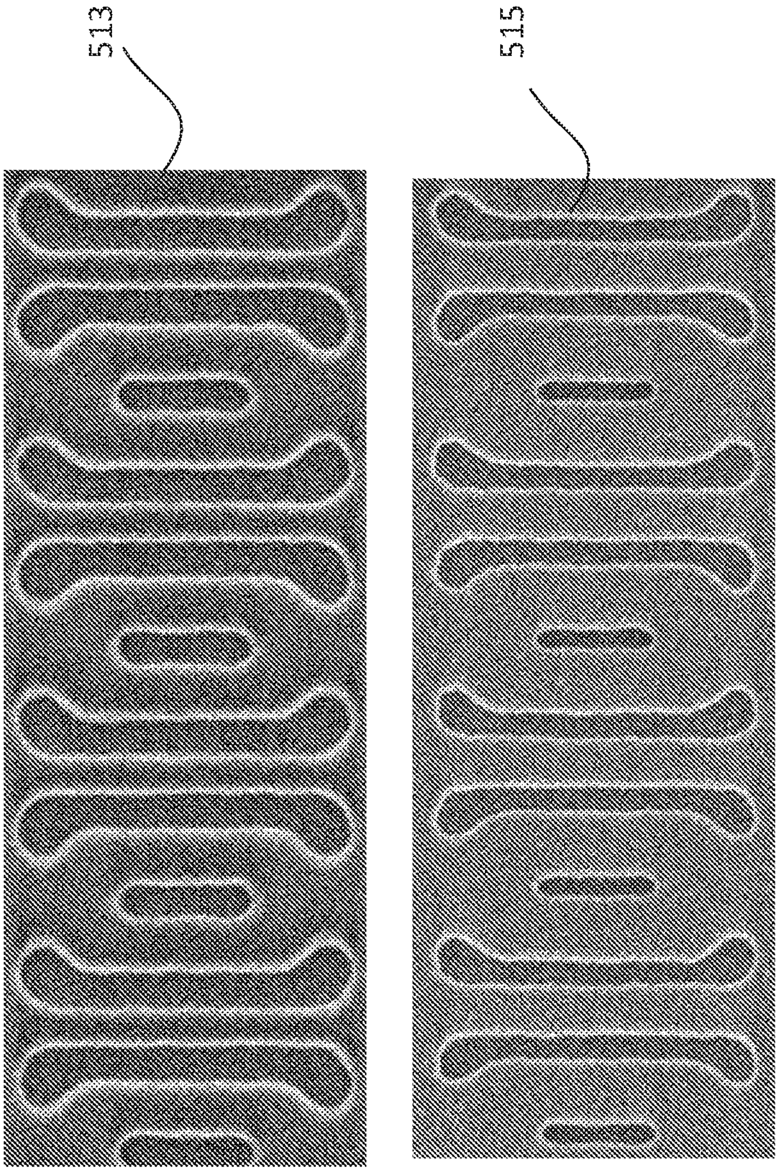
FIG. 5C illustrates an example x-y contours for developed resist features and subsequently for etched features produced using the developed resist having features.

As mentioned, the developed resist feature profiles for a given process influence the etch feature profiles generated in a subsequent etch process. FIG. 5C illustrates an example x-y contours for developed resist features (513) and subsequently for etched features (515) produced using the developed resist having features 513.

Note that the etch conditions may vary from layer-to-layer during fabrication of an integrated circuit chip. Therefore, the demo wafers may be exposed to a different etch process windows to provide various examples for optimizing an etch model and/or generating a transfer function. Of course AEI metrology and characterization are performed for each experiment, collectively spanning a range of mask segments and/or etch process windows. AEI may vary from layer-to-layer in an integrated circuit chip.

All blocks in the upper portion of FIG. 1—above the dashed box—are used to generate data (including optionally images). Such data may feed into a routine for generating a transfer function representing the transfer of one or more segments on a lithography photomask to contours or three-dimensional representations of features printed and subsequently etched into a substrate. Such data may alternatively or additionally be used to calibrate or optimize a resist model and/or an etch model.

Generation of Transfer Function

The blocks within the dashed rectangle are a collection of software modules and/or routines that can be used to generate a transfer function that accounts for variations introduced by both photolithography and etching (or more generally any two successive device fabrication operations that transfer a given pattern). The transfer function may show how a lithography process and a subsequent etch process transfers a contour of a lithography photomask (reticle)

segment to a contour or three dimensional representation of a feature resulting from the photolithography and etch processes.

In some embodiments, a software tool 117 for generating a transfer function, as represented by the components in the dashed box, is employed by a semiconductor device producer to develop a lithography photomask for one if its particular etch and lithography processes. In some embodiments, the software tool (a proximity correction tool) for generating the transfer function is employed by a vendor of semiconductor fabrication equipment, such as a vendor of photolithography equipment and/or etch equipment.

Resist Model

Within software 117 is a resist model 119 that optionally requires calibration or optimization. In certain embodiments, resist model 119 is a focus exposure matrix (FEM) model. It may be embodied in various forms such as a regression model or a neural network (e.g., a convolutional neural network). For a given set of photolithography conditions such as focus and exposure, it receives one or more lithography photomask segments and outputs a predicted profile (e.g., a three-dimensional profile, thickness, sidewall angle, footing, rounding, etc.) of a developed photoresist, which is developed under the set of photolithography conditions and is exposed via the one or more photomask segments. Examples of suitable resist modeling software include the Prolith™ family of simulators available from KLA-Tencor of Milpitas, CA, and Hyperlith™ available from Panoramic Technology Inc, of Burlingame, CA.

In certain embodiments, the resist model outputs a three-dimensional representation of developed resist features. In certain embodiments, the resist model outputs a two-dimensional representation of the developed resist features in the x-y or x-z plane. In certain embodiments, the resist model outputs two two-dimensional representations, one in the x-y plane and the other in the x-z plane.

Optimizing the Resist Model

The resist model 119 might be suitable, without calibration or optimization, for predicting developed resist profiles. For example, it might have been pre-calibrated for the set of photolithography conditions and mask segments to be used in production. However, assuming that the resist model 119 requires optimization, at least for the processes under condition, data generated in the ADI characterization 109 may be used to iteratively calibrate the model. This is reflected in an optimization module 121 and its interaction with the resist model 119. Optimization module 121 receives (i) data representing ADI metrology results from 109 and (ii) post-development resist profiles predicted by resist model 119. In some embodiments, optimization module 121 receives multiple pairs of metrology results and predicted resist profiles, each for a different lithography photomask segment (as provided from a set of clips or gauges in library 103). Discrepancies between the profiles predicted by resist model 119 and the measured ADI results are used to adjust floated parameters in the resist model or otherwise modify the model to improve its predictive ability. Typically, this is an iterative approach in which the modified resist model is provided with a new set of clips or gauges from the library 103 and the modified resist model then predicts the resulting resist profiles, which are then compared with corresponding ADI metrology results via data 109. This procedure continues iteratively until model parameters or other adjustable features converge. The procedure for optimizing a resist model may share many similarities with procedures for optimizing etch profile models, as described below. For example, data reduction and cost function optimization procedures may be employed.

Import Resist Profiles to Etch Model

With the resist model 119 optimized, it can be used to confidently predict post-development resist profiles. As such, the resist model 119 may be used in the next phase of developing a transfer function: optimizing an etch model 125. To begin this process, a new subset of clips or gauges is provided to the optimized resist model which predicts resist profiles for those clips or gauges as indicated at an operation 123 ("import resist profiles").

Figure 2:
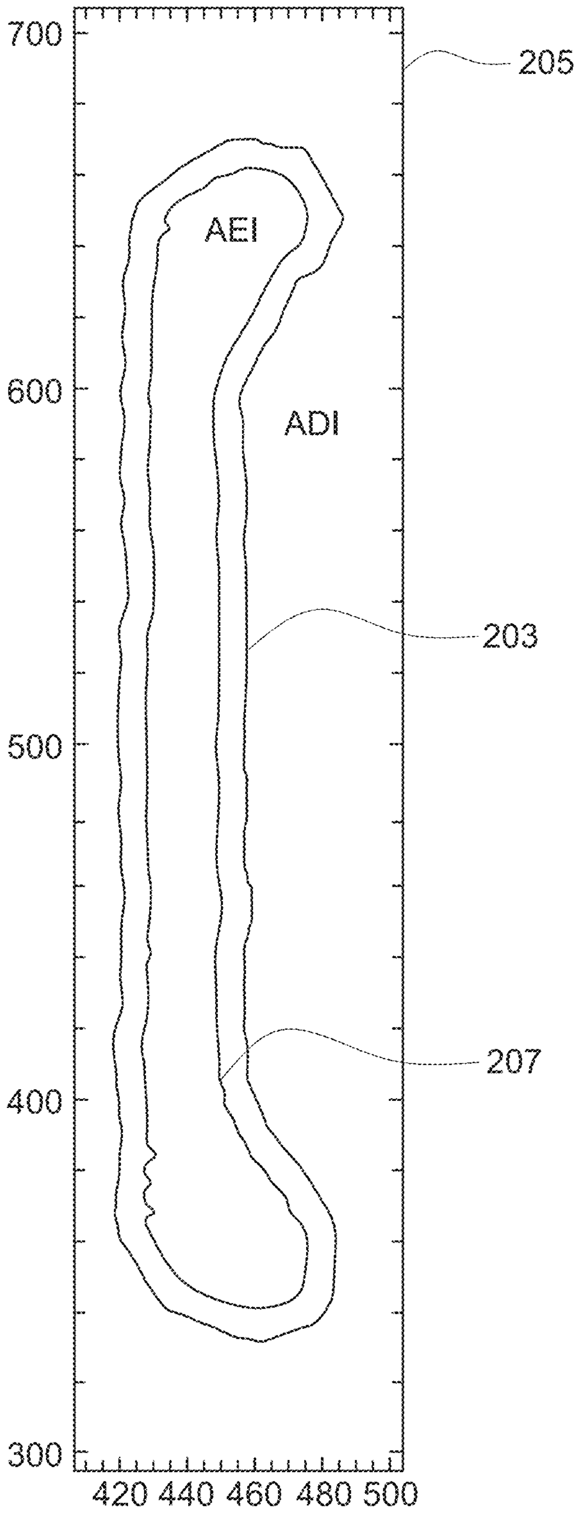
FIG. 2 is a diagram showing, in simplified and hypothetical form, the contour of a segment on a lithography photomask, the contour of a developed resist feature exposed using the segment, and the contour of an etch feature produced by etching through the resist feature.

As illustrated in the simplified example of FIG. 2, a resist profile may have a rounded or rough contour 203 as compared to the more geometrically precise photomask segment (e.g., a gauge or clip used in tools 117) 205.

Etch Model

Etch model 125, which optionally requires calibration or optimization, may be embodied in various forms such as a regression model, a look up table, a support vector machine, or a neural network such as a convolutional neural network. Essentially, for a given set of etch conditions such as etch reactor temperature, pressure, etchant composition, flow rate, plasma conditions, etc., etch model 125 receives an initial layout (pre-etch surface topology of the substrate to be etched) as defined by, e.g., the photoresist profile (e.g., received at 123) and outputs a predicted etch profile (e.g., a two or three-dimensional profile) of a substrate feature that is etched under the set of etch conditions. Etch model 125 is an example of an etch profile model.

In certain embodiments, etch model 125 is a behavioral model as the SEMulator3D™ available from Coventor, Inc. (a Lam Research Company) of Cary, NC In some implementations, behavioral models employ abstractions of processes to predict structural details of features produced by one or more semiconductor device fabrication operations. Examples of behavioral models are presented in U.S. Pat. No. 9,015,016 filed Nov. 25, 2008 by Lorenz et al., and U.S. Pat. No. 9,659,126 filed Jan. 26, 2015 by Greiner et al., each of which is also hereby incorporated by reference in its entirety.

In certain embodiments, etch model 125 is a surface kinetic model (SKM) or similar model that attempts to characterize an etch process by chemical reaction rate constants and/or other mechanistic characteristics of an etch process. Examples of SKMs models include certain models of M. Kushner and co-workers as well as those of Cooperberg and co-workers. The former are described in, e.g., Y. Zhang, "Low Temperature Plasma Etching Control through Ion Energy Angular Distribution and 3-Dimensional Profile Simulation," Chapter 3, dissertation, University of Michigan (2015), and the latter in Cooperberg, Vahedi, and Gottscho, "Semiempirical profile simulation of aluminum etching in a $Cl_2/BCl_3$ plasma," J. Vac. Sci. Technol. A 20(5), 1536 (2002), both of which are hereby incorporated by reference in their entireties. Additional description of the etch profile models of M. Kushner and co-workers may be found in J. Vac. Sci. Technol. A 15(4), 1913 (1997), J. Vac. Sci. Technol. B 16(4), 2102 (1998), J. Vac. Sci. Technol. A 16(6), 3274 (1998), J. Vac. Sci. Technol. A 19(2), 524 (2001), J. Vac. Sci. Technol. A 22(4), 1242 (2004), J. Appl. Phys. 97, 023307 (2005), each of which is also hereby incorporated by reference in its entirety.

In certain embodiments, the etch model outputs a three-dimensional representation of etched features. In certain embodiments, the etch model outputs a two-dimensional representation of the etched features in the x-y or x-z plane.

In certain embodiments, the etch model outputs two two-dimensional representations, one in the x-y plane and the other in the x-z plane.

As mentioned, the predictive ability of an etch model depends on the accuracy of a representation of the after-development resist profile used to conduct the etch process. This is illustrated in FIGS. 5B and 5C, although 5C shows metrology results of an actual physical etch process.

Optimizing the Etch Model

In certain embodiments, the etch model 125 is suitable, without calibration or optimization, for predicting etch profiles. However, in many cases, it is not and therefore requires optimization. Calibration data can come from various sources, but in certain embodiments it includes (a) measurements of demo wafers etched using the process for which the etch model is developed (a production process), and (b) an input photoresist layout to be produced from the production photolithography process. As depicted in FIG. 1, etch model 125 may receive process conditions which were used to etch the demo wafers in 111. Etch model 125 may also receive resist profiles 123 produced by an optimized version of resist model 119. The resist profiles should correspond to clips or gauges employed to etch the demo wafers at 111. Alternatively, the input resist profiles may come from the ADI metrology and characterizations (107 and/or 109). Using these inputs, etch model 125 predicts etch profiles.

In the depicted embodiment, to calibrate etch model 125, an optimization module 127 receives (i) data generated in the AEI characterization 115, and (ii) the predicted etch profiles from etch model 125. In some embodiments, optimization module 127 receives multiple pairs of metrology results and predicted etch profiles, each for a different lithography photomask segment (as provided from a set of clips or gauges in library 103). Discrepancies between the profiles predicted by etch model 125 and the measured AEI results 115 are used to adjust floated parameters in the etch model or otherwise modify the model to improve its predictive ability. Typically, this is an iterative approach in which the modified etch model is provided with a new set of input resist profiles (predicted by optimized resist model 119 from clips or gauges provided from the library 103), and the modified etch model then predicts the resulting etch profiles, which are then compared with corresponding AEI metrology results via data 115. This procedure continues iteratively until model parameters or other adjustable features converge.

Using Optimized Resist and Etch Models to Generate a Transfer Function

When trusted versions of resist model 119 and etch model 125 exist—validated via, e.g., optimization processes as described above—they may be used to produce reliably predicted contours or three dimensional representations of etched features produced using the combination of a photolithography process modelled by resist model 119 and a subsequent etch process modelled by etch model 125. Any given clip or gauge may be provided to resist model 119, which outputs, for a given set of photolithography conditions, a resist profile, which can then be provided as an input to etch model 125. In turn, etch model 125 processes the resist profile and etch conditions to output an etch profile for the clip or gauge.

In certain embodiments, using a set of clips or gauges that represent segments in a full chip photomask layout, optimized resist model 119 and optimized etch model 125, working in tandem as just described, generate a series of etch contours that correspond to the clips or gauges. Thus, each clip or gauge has a corresponding etch contour predicted to be produced by the photolithography process and etch process being modelled (e.g., process for fabricating a layer in a production integrated circuit chip). An example etch feature contour 207 is shown the context of a photomask segment 205 and a resist feature contour 203 in FIG. 2.

Generation of the contours is reflected by a contour-generation module 129. Note that the resist model 119 and etch model 125 may generate three-dimensional profiles that include x and y dimensions on a plane parallel to (or on) the surface of the wafer or integrated circuit chip viewed from above, and a z dimension in the direction normal to the surface of the wafer or integrated circuit. In some contexts, a contour is a two-dimensional representation containing only the x and y dimensions. Note that only the x and y dimensions are used in the design layout provided via tapeout and implemented in a lithography photomask. The contour-generation module 129 receives three-dimensional etch profiles output from an optimized version of etch model 125 and outputs two-dimensional, x-y, contours associated with the clips or gauges used as inputs to the resist model 119. In certain embodiments, contours are generated by specifying z-direction elevation in etch profile or by specifying a material in a stack being etched. In certain embodiments, the contour-generation module 129 outputs a full three-dimensional representation of the etched features.

In some embodiments, contours are also provided via metrology. Thus, for example, x-y contours produced in operations 107/109 and/or 113/115 (see FIG. 5C as an example) are used in conjunction with model-simulated x-y etch contours in the contour generation module or operation 129.

Ultimately, the system 117 (which may be implemented as a suite of software modules) produces, alone or conjunction with metrology results, a set of mask segments (the chosen set of clips or gauges from library 103) and corresponding three-dimensional representations or contours of features produced using the intended production photolithography process and etch process. With these pairs of mask segments and resulting etch contours, a compact modeling module 131 produces a transfer function. As explained, the transfer function relates contours of photomask segments to contours or three-dimensional representations of features produced by a semiconductor device fabrication operation that uses the photomask segments to produce corresponding etch features. For example, compact modeling module 131 identifies patterns in the relationship between a set of mask segments and corresponding set of etched feature contours (produced using the resist model and the etch model) to define the transfer function. Module 131 generates the transfer function by any of a various protocols. In one example, it uses a machine learning system such as a convolutional neural network or recurrent neural network. The transfer function itself may be in the form of any of various relationships or models including neural networks, look up tables, regression models, random forest models, semi-empirical relationships, and the like.

In certain embodiments, compact modeling module 131 also uses information about the physics and/or chemistry of the etch process to develop the transfer function. For example, module 131 may consider plasma component fluxes (e.g., ions, radicals, and/or deposition species), visibility kernels (into features), etc. Regardless of whether the x-y contours (or full three-dimensional representations) are used alone or in conjunction with physical/chemical features of the etch process, module 131 generates the transfer function.

An inverse of the transfer function (a function that outputs a mask segment that will produce a specified etch feature contour) may be employed to provide proximity correction. The inverse transfer function may be generated using the compact modeling module 131 or another piece of software. Regardless of how it is generated, the inverse transfer function may be used in a full chip proximity correction tool such as full-chip OPC (Optical Proximity Correction) tool 133 shown in FIG. 1. As known in the art, full-chip OPC tools are used to design proximity corrected lithography photomasks for desired design layouts, which may be provided via an approved electronic CAD file for full-chip layers of an integrated circuit design. Examples of full-chip OPC tools include Tachyon™ SMO available from ASML Brion of Veldhoven, The Netherlands, and Calibre™ available from Mentor Graphics of Fremont, CA.

In other embodiments, the process described herein may be employed to produce transfer functions for photolithography and subsequent semiconductor fabrication operations other than etch. Examples of such other semiconductor fabrication operations include deposition on a patterned surface, including selective deposition on a surface having two or more different materials.

Terminology

A clip or gauge is segment of a full-chip layout. It may be generated from a test mask or clipped test mask (i.e., one that contains only the polygons of interest) and may be provided in a GDS format (e.g., a GDSII format). GDS is an example of a standard format for design layouts that contain the so-called polygons: there are a few including GDSII "Graphic Database System" and OASIS (Open Artwork Interchange Standard). A gauge file reader may read a test mask, as is conventional in some optical proximity correction contexts, to view locations of the segments of interest to be modeled. These are the clips or gauges provided in a design clip library. Gauges may include coordinates in X/Y, labelling conventions, CD/pitch design as drawn in the layout, etc. Clips or gauges are provided in two-dimensions, parallel to the plane of the integrated circuit chip or lithography photomask.

A "feature" as used herein is non-planar structure on a substrate surface, typically a surface being modified in a semiconductor device fabrication operation. Examples of features include trenches, vias, pads, pillars, domes, and the like. Features may be created by photoresist development, mask definition, lithographic etching, lithographic deposition, epitaxial growth, damascene deposition, and the like. A feature typically has an aspect ratio (depth or height to width). Examples of feature aspect ratios include aspect ratio of at least about 1:0.5, at least about 1:1, at least about 2:1, at least about 5:1, at least about 10:1, or higher. In certain embodiments, a feature has a width dimension (which may be a critical dimension) of between about 10 nm to 500 nm, for example between about 25 nm and about 300 nm. A feature profile may narrow gradually and/or include an overhang at the feature opening. A re-entrant profile is one that narrows from the bottom or interior of the feature to the feature opening.

In various contexts herein, a feature profile refers to a three-dimensional representation of the feature, while a feature contour refers to a two-dimensional representation, typically viewed top down facing the plane of the integrated circuit chip, of the feature.

A production process is a lithography patterning process, an etch process, or other semiconductor device fabrication operation used to produce a commercial integrated circuit chip. The production process is used in an integrated circuit fabrication facility. An integrated circuit provider (e.g. Intel or Qualcomm) provides a design for an integrated circuit and the design is translated to commercial integrated circuit chips by conducting production processes for in a fabrication facility. Multiple production processes are employed to fabricate each layer of an integrated circuit chip.

Transfer function—a function that converts a contour of one or more segments of a lithography photomask to a contour and/or three-dimensional representation of one or more features corresponding to the one or more segments and produced by a semiconductor device fabrication operation (e.g., photolithography or etch or a combination) that attempts to transfer the shape of the one or more segments to a substrate being processed. A contour of a photomask segment is often a polygon having sharp vertices and straight lines connecting adjacent vertices. A contour of a corresponding feature produced by a semiconductor device fabrication operation such as photolithography and/or etching is typically more rounded at the vertices and jagged at the lines between the rounded vertices. As used herein, the term transfer function applies broadly to both the inverse of a transfer function as well as the transfer function. It should be understood that any transfer function may also be viewed as an inverse transfer function, depending on the perspective of the user or application.

The terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. This detailed description assumes the embodiments are implemented on a wafer. However, the disclosure is not so limited. The work piece may be of various shapes, sizes, and materials. Besides semiconductor wafers, other work pieces that may take advantage of the disclosed embodiments include various articles such as printed circuit boards, magnetic recording media, magnetic recording sensors, mirrors, optical elements, micro-mechanical devices and the like.

A "semiconductor device fabrication operation" as used herein is a unit operation performed during fabrication of semiconductor devices. Typically, the overall fabrication process includes multiple semiconductor device fabrication operations, each performed in its own semiconductor fabrication tool such as a plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes. In the context of etch processes, a substrate etch process includes processes that etch a mask layer or, more generally, processes that etch any layer of material previously deposited on and/or otherwise residing on a substrate surface. Such etch process may etch a stack of layers in the substrate.

A "result of a semiconductor device fabrication operation" as used herein is a characteristic of a substrate subjected to a semiconductor fabrication operation. One example of such result is a geometric profile of a substrate after the semiconductor fabrication operation. The profile is a set of points in space representing the positions of a feature or a group of features. As examples, the profile may be a profile of an etched feature, a profile of a deposited feature, a profile of a planarized feature, and the like. In another example, the result of a semiconductor fabrication operation is a signal produced by interaction of incident electromagnetic radiation with one or more substrate features such as an etched feature, a deposited feature, or a planarized feature. In such examples, the result may be, e.g., a reflectance signal which may include reflectance magnitude as a function of wavelength and/or polarization state. The result may also be an ellipsometric signal. In another example, the result of a semiconductor fabrication operation is a set of profile parameters, such as Optical Critical Dimension ("OCD") profile parameters, that characterize a geometry of the of a feature such as an etched feature, a deposited feature, or a planarized feature. Such profile parameters may characterize overall characteristics of a feature such as its average critical dimension, its side wall angles, its depth, and the like.

The result of a semiconductor fabrication operation may be obtained at one time point or over multiple time points during the semiconductor fabrication operation. If the result is provided at only one time point, it may be the point at which the semiconductor fabrication operation is complete.

A "computationally predicted result of the semiconductor device fabrication operation" as used herein is a predicted result of the semiconductor device fabrication operation produced computationally such as a by a computational model, e.g., a process simulation model for the device fabrication operation under consideration. In certain embodiments, a computational process calculates a predicted feature profile represented by geometric profile coordinates. In other cases, the computational process calculates a predicted optical response produced by electromagnetic radiation interacting with a predicted feature profile. In still other cases, the computational process calculates predicted geometric profile parameters of the feature profile (e.g., a set of OCD profile parameters characterizing a geometry of the computed etch profile), as produced by the semiconductor device fabrication operation. In some embodiments, feature profiles, optical responses, and/or profile parameters are computed as a function of time (over which the semiconductor device fabrication operation occurs). In certain embodiments, to predict the result of the semiconductor device fabrication operation, the computation process predicts local reaction rates at a grid of points representing a feature profile on a semiconductor substrate. This results in a substrate/feature profile that deviates from an initial profile used at the beginning of the computations.

Where the computational process calculates a predicted optical response, it may compute a reflectance spectrum or ellipsometric response by simulating reflection of electromagnetic radiation off of said computed etch profile. The reflectance spectrum or ellipsometric response may be generated using, for example, a Rigorous Coupled Wave Analysis ("RCWA") simulation or a Finite Difference Time-Domain ("FDTD") simulation.

In certain embodiments, the computational process produces a time sequence of geometric profiles or profile parameters of a substrate feature. In certain embodiments, the computational process produces a time sequence of computed reflectance spectra or ellipsometric response generated by simulating reflection of electromagnetic radiation off of a computed substrate feature profile at different times. The time sequence may be produced at different durations of the semiconductor device fabrication operation. The computationally predicted result of the semiconductor device fabrication operation may be provided for substrate subtractive processes and/or substrate additive processes.

A "metrology result" as used herein refers to a result produced, at least in part, by measuring features of the processed substrate. The measurement may be made while or after performing the semiconductor device fabrication operation in a reaction chamber operating under the set of fixed process parameter values. In certain embodiments, measuring features of the processed substrate produces profile coordinates. In such embodiments, measuring features of the processed substrate may include performing microscopy (e.g., SEM, TEM, STEM, REM, AFM), or optical metrology on the etched substrate. When using optical metrology, the system may obtain profile coordinates by calculating them from measured optical metrology signals. In certain embodiments, the metrology result is produced by converting measured feature profile coordinates to a set of geometric profile parameters characterizing a geometry of the feature in the processed substrate (e.g., critical dimension, side wall angles, depth, etc.). In certain embodiments, the metrology result is produced by performing reflectometry, dome scatterometry, angle-resolved scatterometry, small-angle X-ray scatterometry and/or ellipsometry on a processed substrate. In certain embodiments, the metrology result is endpoint detection for a particular process. The endpoint detection, which may be determined in situ, may be measured by various optical techniques.

In certain embodiments, the metrology result is provided as a time sequence of measured geometric profiles, reflectance or ellipsometric data, or profile parameters of a substrate feature. These measured metrology results are produced at the different durations of the semiconductor device fabrication operation.

A "process simulation model" as used herein is a computational model that predicts a result of a semiconductor device fabrication operation. In other words, it outputs the result. As explained, examples of results include feature profiles (e.g., detailed Cartesian coordinates of a feature), profile parameters characterizing a feature (e.g., critical dimension, sidewall angles, depth, etc.), and/or reflectance/ellipsometric data created if optical metrology was used to probe features. The results are based on features produced or modified during the simulated semiconductor device fabrication operation. The results may be predicted at one or more times during the semiconductor device fabrication operation.

Inputs to the process simulation model include one or more process parameter values that characterize the semiconductor device fabrication operation. Often process parameters used as inputs are reactor conditions such as temperature (pedestal, showerhead, etc.), plasma conditions (density, potential, power, etc.), process gas conditions (composition such as partial pressures of components, flow rate, pressure, etc.), and the like. Typically, the process simulation model also receives an initial profile substrate, which represents the profile of the substrate surface immediately before being processed via the modeled semiconductor device fabrication operation. In a simple case, the initial profile is a simply a planar surface. More typically, initial profile has features such as mask or photoresist features.

Sometimes, the process simulation model simulates a subtractive process such as a substrate etch process or a planarization process. In various embodiments, the process simulation model is an etch profile model as described herein. Sometimes, the process simulation model simulates an additive process such as a substrate deposition process (e.g., chemical vapor deposition, physical vapor deposition, atomic layer deposition, etc.). In certain embodiments, a process simulation model is a resist model as described above.

A "configured process simulation model" as used herein describes a process simulation model configured with one or floated process model parameters. When so configured, and after receiving the input process parameters and the substrate initial profile, a process simulation model can execute to predict a result of a semiconductor device fabrication operation.

A "process parameter" as used herein is a parameter that characterizes a process occurring in reaction chamber or photolithography apparatus during a semiconductor device fabrication operation, often on a substrate surface being modified by the operation. Typically, many such process parameters are needed to uniquely characterize the process. Some process parameters characterize aspects of the process that are relatively easy to control and/or measure. Examples of such process parameters include temperature (of a pedestal, showerhead, etc.), plasma conditions (plasma density, plasma potential, applied power, etc.), process gas conditions (composition such partial pressures of components, flow rate, pressure, etc.), and adjustable chamber geometry parameters such as separation between the pedestal and showerhead. Other process parameters characterize aspects of the process that are not directly controllable and/or are not easily measured. Examples of such process parameters include local conditions such as plasma density, direction, or energy at a location on the substrate surface, and mechanistic characteristics such as a reaction rate constant, a reactant and/or product sticking coefficient, a reactant diffusion constant, a product diffusion constant, an optical dispersion property, and combinations thereof. A value of the process parameter is used as an input to or configuration of a process simulation model. The value may be a scalar, a vector, matrix, a tensor, etc.

A "fixed process model parameter" as used herein is a process parameter required by a process simulation model but whose value is fixed during an optimization process used to improve the performance of the process simulation model. In other words, a value of fixed process model parameter does not change during the optimization process. This is distinct from a floated process model parameter, whose value changes during the optimization exercise. In some embodiments, a fixed process model parameter is directly controllable and/or easy to measure. Examples include a temperature in a reaction chamber, one or more applied radio frequency or plasma conditions in the reaction chamber, one or more process gas conditions in the reaction chamber, a pressure in the reaction chamber, or any combination thereof. However, a fixed process model parameter may alternatively be local or mechanistic parameter. Sometimes for convenience in a model optimization process described herein, a value of a fixed process model parameter or a group of such values is represented by the symbol $\mu$.

A "floated process model parameter" as used herein is a process parameter required by a process simulation model but whose value floats (changes, adjusts, etc.) during an optimization process. An iterative modification of a floated process model parameter value from an initial or seed value to a final value is a goal of the model optimization process. If the optimization routine succeeds, a process simulation model configured with a final value of the floated process model parameter provides better predictive capability than a process simulation model configured with the initial value of the floated process model parameter.

In certain embodiments, a floated process model parameter represents a characteristic of a substrate undergoing the semiconductor device fabrication operation. General examples include difficult to measure local conditions in a reactor and/or mechanistic properties of reactions during the semiconductor device fabrication operation. In some examples, the characteristic is a reaction rate constant, a reactant and/or product sticking coefficient, a reactant diffusion constant, a product diffusion constant, local plasma properties (e.g., ion flux, ion direction, radical flux, etc. at the substrate surface), an optical dispersion property, or any combination thereof. However, the floated process model parameter is not limited to such parameters. Parameters that might more typically be used as fixed process model parameters may also be used or used as or as a part of the floated process model parameter(s). Examples of such non-mechanistic parameters include a temperature in the reaction chamber, one or more RF conditions in the reaction chamber, one or more process gases in the reaction chamber, a pressure in the reaction chamber, applied plasma conditions, or any combination thereof. In some embodiments, floated process model parameters include more globally focused parameters for a given process, which is represented by the process simulation model. Examples of such floated process model parameters include vertical etch rate, lateral etch rate, nominal etch depth, etch selectivity, vertical deposition rate, plasma angular dependence of sputter yield, and plasma energy dependence of sputter yield, all for a given material subject to a given semiconductor device fabrication operation. Other examples of floated process model parameters include tilt angle of ion entry, twist angle of ion entry, visibility (e.g., into a feature) for etch and/or deposition, angular distribution (sometimes called source sigma), sticking coefficient (sometimes called isotropic ratio), sputter maximum yield angle, sputtering ratio, and etch ratio per crystal direction, again all for a given material subject to a given semiconductor device fabrication operation.

In various embodiments, the floated process model parameter combines any two or more of the process model parameters characterizing the substrate undergoing the semiconductor device fabrication operation. The combination may be a product or sum of the individual values of the parameters, either of which may be weighted based on the relative importance of the individual parameters to the predictive ability of the model or based on other factors. Sometimes, some or all values of the individual parameters are normalized prior to the combination. In some embodiments, the individual values are provided as separate contributions in the form of a vector. In one example, the combination of parameters can be the ion density and reaction rate with the materials on the surface. Without any other factors considered, the probability of removal would be proportional to the product of ion density, reaction rate, substrate material density, and surface area of original profile. As a result, ion density and reaction rate cannot be uniquely determined but their product can be. In some cases, the floated process model parameter does not have a known connection to particular physical and/or chemical processes of the device fabrication operation. Such floated process model parameters may be appropriate when optimizing behavioral process simulation models.

During an iterative optimization process, the value of a floated process model parameter, at any iteration, is deemed the "current value" of the floated process model parameter. The value of the parameter during a prior iteration might be called a prior value of the floated process model parameter, and the value of the parameter during a successive iteration might be called a successive value of the floated process model parameter. A modification of the value of a floated process model parameter from one iteration to the next is sometimes called an update of the current value of the floated process model parameter. At the end of the iterative optimization process, the value of the floated process model parameter is called the final value of the floated process model parameter.

To "optimize" a process simulation model, such as a resist model or an etch model as described herein, is to improve the ability of the process simulation model to predict the result of a result of a semiconductor device fabrication operation that the model is designed to simulate. Often in the discussion herein, an optimization routine optimizes a process simulation model by iteratively adjusting the current value of one or more floated process model parameters. During optimization, a computationally predicted result of a process simulation model, which uses current value(s) of the floated process model parameter(s), may be compared with an experimentally determined result (e.g., a metrology result), with both the predicted result and the experimentally determined result being generated for the same semiconductor device fabrication operation. The comparison provides a cost value that reflects the magnitude of the difference (or agreement) between the predicted/simulation result and the experimentally determined result. The optimization routine uses the cost value to at least (i) determine whether the value(s) of the floated process model parameter value(s) have converged, and (ii) if the value(s) have not converged, determining how to adjust the current value(s) of the floated process model parameter(s) for the next iteration. In certain embodiments, the process uses not only the cost value of the current iteration, but the prior cost values of all or some of the historical iterations, to search for a global optimum.

To "compare" values of a computationally predicted result of a process simulation model and an experimentally determined result (e.g., a metrology result), as used herein, means to compare one or more features or indices of the two results. The comparison provides a cost value or values for the optimization process. Examples of differences (cost values) include L1 and L2 norms, a Euclidean distance, and Mahalanobis distance in multidimensional result space. As an example using results having multiple features or indices, the comparison may be done by extracting multiple indices to describe differences. As examples, these indices may be the critical dimension (CD) differences at multiple heights of a feature, process endpoint differences (e.g., differences in the endpoint of an etch process), thickness differences for a given material, or spectra differences within an entire spectra. These indices make up the cost function for optimization; the function may also be a combination of them, with weight factors for each. The cost function is sometimes referred to herein as a "difference," which should be interpreted more broadly than the simple mathematical operation A minus B.

The floated process model parameter values "converge," as used herein, when a process simulation model configured with them performs adequately for the application at hand. Various convergence criteria are known in the art and may be applied. Some of them are described below. Generally, cost values are evaluated in each iteration of an optimization routine. A cost value produced during a single iteration may be evaluated in isolation or in conjunction with cost values from other iterations. Such evaluation allows the optimization routine to conduct a convergence check. If the cost value or cost values indicate the current value of the floated process model parameter provides a process simulation model that performs acceptably and/or is no longer improving significantly, the optimization routine terminates the process and deems the current value of the floated process model parameter to be the final value. The optimization routine has converged. Thus, in certain embodiments, the convergence method determines when the error of parameter estimation (cost function) can no longer be improved. This allows a Bayesian view to the termination problem. The convergence check may search for local or global minimum in the cost value (or maximum depending on the structure of the cost value).

Etch Profile Models

Etch profile models (EPMs) are a type of etch model as described herein. They compute a theoretically determined etch profile from a set of input etch reaction parameters (independent variables) characterizing some features of the etch reaction such as certain underlying physical and chemical etch processes and reaction mechanisms. These processes may be modelled as a function of time and location in a grid representing features being etched and their surroundings. Examples of input parameters include plasma parameters such as ion flux and chemical reaction parameters such as the probability that a particular chemical reaction will occur. Other examples, include characteristics of the substrate being etched (e.g., a layer-by-layer description of thicknesses and materials), an initial mask layout for one or more features to be etched, process chamber conditions, and the like. Such parameters may be obtained from various sources, including other models which calculate them from general reactor configurations and process conditions such as pressure, substrate temperature, plasma source parameters (e.g., power, frequencies, duty cycles provided to the plasma source), reactants, and their flow rates. In some embodiments, such models may be part of the EPM.

EPMs take such parameters as independent variables (which may be fixed and/or floated in the context of the optimization routines described herein) and functionally generate etch profiles as response variables. In other words, a set of independent variables are the parameters used as inputs to the model, and response variables are the etch profile features calculated by the model. The EPMs may employ one or more relationships between the reaction parameters and the etch profile. The relationships may include, e.g., coefficients, weightings, and/or other model parameters (as well as linear functions of, second and higher order polynomial functions of, etc. the reaction parameters and/or other model parameters) that are applied to the independent variables in a defined manner to generate the response variables, which are related to the etch profiles. Such weightings, coefficients, etc. may represent one or more of the reaction parameters described above. In some embodiments, these model parameters are the floated process model parameter values that are tuned or adjusted during the optimization techniques described herein. In some embodiments, some of the reaction parameters are model parameters to be optimized, while others are used as fixed process model parameters. For example, in some embodiments, chemical reaction parameters may be optimizable floated process model parameters, while plasma parameters may be fixed process model parameters.

As explained, some EPMs employ fundamental reaction mechanistic parameters and may be viewed as fundamental to the underlying chemistry and physics and therefore the experimental process engineer generally does not have control over these quantities. In the etch profile model, these variables may be applied at each location of a grid and at multiple times, separated by defined time steps. In some implementations, the grid resolution may vary between about a few Angstroms and about a micrometer. In some implementations employing time dependent modeling, the time steps may vary between about 1e-15 and 1e-10 seconds. In certain embodiments, the optimization employs two types of mechanistic independent variables: (1) local plasma parameters, and, and (2) local chemical reaction parameters. These parameters are "local" in the sense that they may vary a function of position, in some cases down to the resolution of the grid. Examples of the plasma parameters include local plasma properties such as fluxes and energies of particles such ions, radicals, photons, electrons, excited species, depositor species and their energy and angular distributions etc. Examples of chemical and physico-chemical reaction parameters include rate constants (e.g., probabilities that a particular chemical reaction will occur at a particular time), sticking coefficients, energy threshold for etch, reference energy, exponent of energy to define sputter yields, angular yield functions and its parameters, etc. Further, the parameterized chemical reactions may include reactions in which the reactants include the material being etched and an etchant. It should be understood that the chemical reaction parameters may include various types of reactions in addition to the reactions that directly etch the substrate. Examples of such reactions include side reactions, including parasitic reactions, deposition reactions, reactions of by-products, etc. Any of these might affect the overall etch rate. It should also be understood that the model may require other input parameters, in addition to the above-mentioned plasma and chemical reaction input parameters. Examples of such other parameters include the temperature at the reaction sites, the partial pressure or reactants, etc. In some cases, these and/or other non-mechanistic parameters may be input in a module that outputs some of the mechanistic parameters. In some embodiments, models do not employ mechanistic parameters, at least not directly.

Initial (unoptimized) values for the EPM model variables, as well as variables that are fixed during optimization (e.g., the plasma parameters in some embodiments) may be obtained from various sources such as the literature, calculations by other computational modules or models, etc. In some embodiments, the independent input variables—such as the plasma parameters—may be determined by using a model such as, for the case of the plasma parameters, from an etch chamber plasma model. Such models may calculate the applicable input EPM parameters from various process parameters over which the process engineer does have control (e.g., by turning a knob)—e.g., chamber environment parameters such as pressure, flow rate, plasma power, wafer temperature, ICP coil currents, bias voltages/power, pulsing frequency, pulse duty cycle, and the like.

EPMs may take any of many different forms. Ultimately, they provide a relationship between the independent and response variables. The relationship may be linear or non-linear. In certain embodiments, an EPM is what is referred to in the art as a cell-based Monte Carlo surface reaction model. These models, in there various forms, operate to simulate a wafer feature's topographical evolution over time in the context of semiconductor wafer fabrication. The models launch pseudo-particles with energy and angular distributions produced by a plasma model or experimental diagnostics for arbitrary radial locations on the wafer. The pseudo-particles are statistically weighted to represent the fluxes of radicals and ions to the surface. The models address various surface reaction mechanisms resulting in etching, sputtering, mixing, and deposition on the surface to predict profile evolution. During a Monte Carlo integration, the trajectories of various ion and neutral pseudo-particles are tracked within a wafer feature until they either react or leave the computational domain. The EPM has advanced capabilities for predicting etching, stripping, atomic layer etching, ionized metal physical vapor deposition, and plasma enhanced chemical vapor deposition on various materials.

In some embodiments, an EPM utilizes a rectilinear mesh in two or three dimensions, the mesh having a fine enough resolution to adequately address/model the dimensions of the wafer feature (although, in principle, the mesh (whether 2D or 3D) could utilize non-rectilinear coordinates as well). The mesh may be viewed as an array of grid-points in two or three dimensions. It may also be viewed as an array of cells which represent the local area in 2D, or volume in 3D, associated with (centered at) each grid-point. Each cell within the mesh may represent a different solid material or a mixture of materials. Whether a 2D or 3D mesh is chosen as a basis for the modeling may depend on the class/type of substrate feature being modelled. For instance, a 2D mesh may be used to model a long trench feature (e.g., in a polysilicon substrate), the 2D mesh delineating the trench's cross-sectional shape under the assumption that the geometry of the ends of the trench are not too relevant to the reactive processes taking place down the majority of the trench's length away from its ends (i.e., for purposes of this cross-sectional 2D model, the trench is assumed infinite, again a reasonable assumption for a trench feature away from its ends). On the other hand, it may be appropriate to model a circular via feature (a through-silicon via (TSV)) using a 3D mesh (since the x,y horizontal dimensions of the feature are on par with each other).

Mesh spacing may range from, e.g., sub-nanometer (e.g., from 1 Angstrom) up to several micrometers (e.g., 10 micrometers). Generally, each mesh cell is assigned a material identity, for example, photoresists, polysilicon, gaseous etchant or plasma (e.g., in the spatial region not occupied by the feature), which may change during the profile evolution. Solid phase species may be represented by the identity of the material in a computational cell; gas phase species may be represented by computational pseudo-particles. In this manner, the mesh provides a reasonably detailed representation (e.g., for computational purposes) of the substrate feature and surrounding gas environment (e.g., plasma) as the geometry/topology of the wafer feature evolves over time in a reactive etch process.

Some of the foregoing description has focused on process simulation models, such as surface kinetic models, that employ a mechanistic representation of a semiconductor device fabrication operation. Such models are described in more detail in US Patent Application Publication No. 20170228482, filed Feb. 8, 2016 and US Patent Application Publication No. 20170363950, filed Jun. 21, 2016, both incorporated herein by reference in its entirety. However, certain embodiments use quite different models to represent semiconductor device fabrication operations. In some cases, models do not employ mechanistic parameters that attempt to explain the underlying chemistry or physics of a semiconductor device fabrication operation, at least not directly. For example, behavioral models may employ abstractions of processes to predict structural details of features produced by one or more semiconductor device fabrication operations. One example of a behavioral model is the SEMulator3D™ from Coventor, a Lam Research Company. Examples of behavioral models are presented in U.S. Pat. Nos. 9,015,016 and 9,659,126, both previously incorporated by reference.

In various embodiments, process simulation models described herein model a feature in three dimensions. In some cases, process simulation models described herein predict the impact of a semiconductor device fabrication operation on not just one feature but on a group of features over an area of a design layout (e.g., over large, multi-device areas).

While the foregoing description has focused on etch models, this disclosure also pertains to other models such as models for predicting the effect of a planarization process or a deposition process on a substrate.

Experiments and Profile Measurements

To optimize process simulation models, such as resist models and/or etch models, various experiments may be performed in order to determine—as accurately as the experiments allow—the actual profiles which result from actual processes performed under the various process conditions as specified by various sets of process parameters. Thus, for instance, one specifies a first set of values for a set of process parameters—such as etchant flow rate, plasma power, temperature, pressure, etc.—sets up the chamber apparatus accordingly, flows etchant into the chamber, strikes the plasma, etc., and proceeds with the processing of the first semiconductor substrate to generate a first profile. One then specifies a second set of values for the same set of process parameters, processes a second substrate to generate a second profile, and so forth.

Various combinations of process parameters may be used to present a broad or focused process space, as appropriate, to optimize the process simulation model. The same combinations of process parameters are then used to calculate (independent variables) input parameters, such as the mechanistic parameters, by the process simulation model to provide profile outputs (response variables) that can be compared against the experimental results. Because experimentation can be costly and time consuming, techniques can be employed to design experiments in a way that reduces the number of experiments that need be conducted to provide a robust training set for optimizing the process simulation model. Techniques such as design of experiments (DOE) may be employed for this purpose. Generally, such techniques determine which sets of process parameters to use in various experiments. They choose the combinations of process parameters by considering statistical interactions between process parameters, randomization, and the like. As an example, DOE may identify a small number of experiments covering a limited range of parameters around the center point of a process that has been finalized.

In some approaches, a researcher will conduct all experiments early in the model optimization process and use only those experiments in the optimization routine iterations until convergence. Alternatively, an experiment designer may conduct some experiments for early iterations of the optimization and additional experiments later as the optimization proceeds. The optimization process may inform the experiment designer of particular parameters to be evaluated and hence particular experiments to be run for later iterations.

One or more in situ or offline metrology tools may be used to measure the experimentally-generated profiles which result from these experimental process operations. Measurements may be made at the end of the processes, during the processes, or at one or more times during the processes. When measurements are made at the end of a process, the measurement methodology may be destructive, when made at intervals during the etch process, the measurement methodology would generally be non-destructive (so not to disrupt the etch). Examples of appropriate metrology techniques include, but not limited to, in-situ reflectometry, OCD, cross-sectional SEM, and others mentioned above. Note that a metrology tool may directly measure a feature's profile, such as in the case of SEM (where the experiment basically images a feature's etch profile), or it may indirectly determine a feature's etch profile, such as in the case of OCD measurements (where some post-processing is done to back-out the feature's etch profile from the actual measured data). Metrology techniques may be categorized by where they are conducted and what they do to the sample; categories include in-situ, offline nondestructive, and destructive metrology. In situ metrology includes, for example, reflectometry and ellipsometry; offline nondestructive metrology includes, for example, single-wavelength and broadband OCD metrology or scatterometry, dome scatterometry, CD-SAXS, and CD-SEM (top-down SEM); and destructive metrology includes, for example, X-SEM, STEM, and TEM.

In any event, the result of the experiments and metrology procedures is a set of measured profiles, each generally including a series of values for a series of coordinates or a set of grid values which represent the shape of the feature's profile as described above. The profiles are then be used as inputs to train, optimize, and improve the computerized etch profile models as described herein.

Reflectometry and Ellipsometry Spectra Analytical and Modeling Tools

When using a process simulation model to generate the feature profile values, optical parameters generated from the geometry may be modeled or predicted using an optical modeling routine such as the RCWA method or similar technique.

RCWA is but one method that can be used to describe the characteristics of reflected (diffracted, scattered) radiation from a periodic structure such as a grating, or transmitted through such a grating. RCWA was largely developed by Moharam and Gaylord and described in the scientific literature. See e.g., M. G. Moharam and T. K. Gaylord "Rigorous coupled-wave analysis of planar-grating diffraction" J. Opt Soc of America, Vol. 71, Issue 7, pp. 811-818 (1981), incorporated herein by reference in its entirety. RCWA calculates the intensity and polarization characteristics of the various diffracted orders (zeroth order and higher orders). Other optical modeling methods that can provide results include, but are not limited to, C method, Modal method, Rayleigh approximation, EFIE (e-field integration equation), and Cf-FFT (conjugate gradient-fast fourier transform).

RCWA is a semi-analytical method in computational electromagnetics that is often employed to solve scattering from periodic dielectric structures. It is a Fourier-space method so devices and fields are represented as a sum of spatial harmonics. The method is based on Floquet's theorem that the solutions of periodic differential equations can be expanded with Floquet functions (or sometimes referred as Block wave, especially in solid-state physics). A device is divided into layers that are each uniform in the z direction. A staircase approximation is needed for curved devices with properties such as dielectric permittivity graded along the z-direction. The electromagnetic modes in each layer are calculated and analytically propagated through the layers. The overall problem is solved by matching boundary conditions at each of the interfaces between the layers using a technique like scattering matrices. To solve for the electromagnetic modes, which are decided by the wave vector of the incident plane wave, in periodic dielectric medium, Maxwell's equations (in partial differential form) as well as the boundary conditions are expanded by the Floquet functions and turned into infinitely large algebraic equations. With the cutting off of higher order Floquet functions, depending on the accuracy and convergence speed one needs, the infinitely large algebraic equations become finite and thus solvable by computers.

Another way to computationally generate optical parameters produced (or producible) by optical beam interaction with substrate features is by using a finite-difference time-domain (FDTD) method. This is a numerical analysis technique for modeling electrodynamics. It is a grid-based finite difference method for finding approximate solutions to the time-dependent Maxwell's equations in partial differential form. The equations are discretized in time and space partial derivatives. The resulting finite-difference equations are solved in a leapfrog manner: the electric field vector components in volume space are solved at a given instant in time, and then the magnetic field vector components in the same spatial volume are solved at the next instant in time, and the process is repeated until the desired transient or steady-state electromagnetic field is calculated.

Convergence Checking

A floated process model parameter optimization procedure may be an iterative non-linear optimization procedure—e.g., it optimizes an error metric or cost value that is, in general, a non-linear function of the input parameters—and, as such, various techniques known in the art for non-linear optimization may be employed. See, for example: Biggs, M. C., "Constrained Minimization Using Recursive Quadratic Programming," Towards Global Optimization (L. C. W. Dixon and G. P. Szergo, eds.), North-Holland, pp 341-349, (1975); Conn, N. R., N. I. M. Gould, and Ph. L. Toint, "Trust-Region Methods," MPS/SIAM Series on Optimization, SIAM and MPS (2000); More, J. J. and D. C. Sorensen, "Computing a Trust Region Step," SIAM Journal on Scientific and Statistical Computing, Vol. 3, pp 553-572, (1983); Byrd, R. H., R. B. Schnabel, and G. A. Shultz, "Approximate Solution of the Trust Region Problem by Minimization over Two-Dimensional Subspaces," Mathematical Programming, Vol. 40, pp 247-263 (1988); Dennis, J. E., Jr., "Nonlinear least-squares," State of the Art in Numerical Analysis ed. D. Jacobs, Academic Press, pp 269-312 (1977); More, J. J., "The Levenberg-Marquardt Algorithm: Implementation and Theory," Numerical Analysis, ed. G. A. Watson, Lecture Notes in Mathematics 630, Springer Verlag, pp 105-116 (1977); Powell, M. J. D., "A Fast Algorithm for Nonlinearly Constrained Optimization Calculations," Numerical Analysis, G. A. Watson ed., Lecture Notes in Mathematics, Springer Verlag, Vol. 630 (1978); each of which is hereby incorporated by reference in its entirety.

In general, the comparison used to calculate cost compares multiple aspects or indices of the computationally predicted and metrology results. The differences between computationally generated and measured values of these indices make up the cost function for optimization. Examples of the indices include the critical dimension (CD) differences for multiple heights of a material, thickness differences for a given material, and spectra differences of the entire spectra. The cost function may be a combination of them, optionally with weight factors for each. The differences may be expressed as the L1 or L2 norm, a Euclidean distance, a Mahalanobis distance, etc. In some embodiments, these techniques optimize an objective function (here the cost function/value) subject to certain constraints which may be placed on the input parameters and/or the error metric. In certain such embodiments, the constraint functions themselves may be non-linear. For example, in embodiments where the computed etch profile is represented with a set of stacked trapezoids which are output by the process simulation model, the cost value may be defined as the difference between the area represented by the boundaries of these stacked trapezoids and the area of the measured experimental etch profile. In this case, the error metric is a non-linear function of the response variables output by the process simulation model, and thus a constrained optimization technique is selected from those just described (and/or from the incorporated references) which allows for the specification of non-linear constraints.

Applications of Optimized Process Simulation Models

The transfer functions disclosed herein may be useful in semiconductor processing workflows wherever a detailed assessment and characterization of an etch process is desirable. For instance, if a new etch process is being developed, the transfer function may be used to determine etch profile characteristics for many combinations of process parameters without having to go into the lab and perform each experiment individually. In this way, the transfer function may enable quicker process development cycles, and in some embodiments may significantly reduce the amount of work required to fine tune a target profile.

Lithographic operations and mask development may benefit greatly from an accurate transfer function. U.S. patent application Ser. No. 15/367,060, filed Dec. 1, 2016, which is incorporated herein by reference in its entirety, describes edge placement error detection and lithographic mask design. Note that there are at least two levels of design layout correction that may be applicable in this context: lithography and etch. In other words, both optical and etch-based considerations may be used to determine a mask layout. The etch-based considerations are determined using a model prepared as described herein.

To manufacture a photolithography mask using a layout determine as described herein, a process begins with a so-called blank that includes a glass substrate coated with a chrome layer and a resist layer. Sometimes a material other chrome or in addition to chrome is used. For example, attenuated phase shift masks use an additional layer such as a molybdenum silicide layer. The resist may be a positive or negative resist. Upon electron beam exposure, a pattern formed is formed on the resist that can be transferred into the underlying chrome layer via an etch process. The chrome provides opaque areas on the photolithography mask which cast shadows during exposure of semiconductor wafers.

The manufacturing of photolithography masks is similar lithography steps during semiconductor device manufacture. However, the exposure of the resist which is done by electron beams as opposed to light (e.g., deep UV). The blank is exposed to electron beam radiation that impinges on the resist in locations specified by the mask design layout, which is determined at least in part using an EPM of a type described herein. Subsequently, the mask is developed to produce the pattern of the layout. The now formed resist pattern is then transferred to the underlying chrome by an appropriate etch process (e.g., plasma or wet etching). Thereafter, the resist is removed and the exposed chrome pattern is covered with a pellicle to prevent contamination.

The transfer functions disclosed herein may also be useful for solving the reciprocal problem: where one desires a specific target etch profile and wants to discover one or more specific combinations of photolithography or process parameters (or EPM input parameters) for achieving it. Again, this could be done by experimental trial and error, but an accurate transfer function can replace the need for experimentation, or at least do so in the initial phases of exploring the process/input parameter space, until good candidates may be identified for full experimental study. For example, the etch model of blocks 125 and 127 may be iteratively run with various process conditions within a process window reliably handled by the model, and after each run the compact model determines whether resulting etch feature profile/contour is within specification or optimized. After homing in on a set of process conditions that produces the required etch feature/contour, a process recipe is fixed. And concurrently, the inverse transfer function identifies a mask layout to be used in conjunction with the process recipe.

Context for Disclosed Computational Embodiments

Certain embodiments disclosed herein relate to systems for generating and/or using process simulation models and/or transfer functions. Certain embodiments disclosed herein relate to methods for generating and/or using a process simulation model implemented on such systems. A system for generating a process simulation model may be configured to analyze data for calibrating or optimizing the expressions or relationships used to represent the effects of a semiconductor device fabrication operation on a substrate. A system for generating a process simulation model and/or transfer function may also be configured to receive data and instructions such as program code representing physical processes occurring during the semiconductor device fabrication operation. In this manner, a process simulation model and/or transfer function is generated or programmed on such system. A programmed system for using a process simulation model and/or transfer function may be configured to (i) receive input such as process parameters characterizing the semiconductor device fabrication operation and/or an initial design layout or mask for producing features in a substrate, and (ii) execute instructions that determine the effect of the semiconductor device fabrication operation on the substrate. To this end, the system may calculate time-dependent (or time-independent) result of a semiconductor device fabrication operation.

Many types of computing systems having any of various computer architectures may be employed as the disclosed systems for implementing process simulation models and transfer functions, and algorithms for generating and/or optimizing such models and functions. For example, the systems may include software components executing on one or more general purpose processors or specially designed processors such as programmable logic devices (e.g., Field Programmable Gate Arrays (FPGAs)). Further, the systems may be implemented on a single device or distributed across multiple devices. The functions of the computational elements may be merged into one another or further split into multiple sub-modules.

In some embodiments, code executed during generation or execution of a process simulation model on an appropriately programmed system can be embodied in the form of software elements which can be stored in a nonvolatile storage medium (such as optical disk, flash storage device, mobile hard disk, etc.), including a number of instructions for making a computer device (such as personal computers, servers, network equipment, etc.).

At one level a software element is implemented as a set of commands prepared by the programmer/developer. However, the module software that can be executed by the computer hardware is executable code committed to memory using "machine codes" selected from the specific machine language instruction set, or "native instructions," designed into the hardware processor. The machine language instruction set, or native instruction set, is known to, and essentially built into, the hardware processor(s). This is the "language" by which the system and application software communicates with the hardware processors. Each native instruction is a discrete code that is recognized by the processing architecture and that can specify particular registers for arithmetic, addressing, or control functions; particular memory locations or offsets; and particular addressing modes used to interpret operands. More complex operations are built up by combining these simple native instructions, which are executed sequentially, or as otherwise directed by control flow instructions.

The inter-relationship between the executable software instructions and the hardware processor is structural. In other words, the instructions per se are a series of symbols or numeric values. They do not intrinsically convey any information. It is the processor, which by design was preconfigured to interpret the symbols/numeric values, which imparts meaning to the instructions.

The models used herein may be configured to execute on a single machine at a single location, on multiple machines at a single location, or on multiple machines at multiple locations. When multiple machines are employed, the individual machines may be tailored for their particular tasks. For example, operations requiring large blocks of code and/or significant processing capacity may be implemented on large and/or stationary machines.

In addition, certain embodiments relate to tangible and/or non-transitory computer readable media or computer program products that include program instructions and/or data (including data structures) for performing various computer-implemented operations. Examples of computer-readable media include, but are not limited to, semiconductor memory devices, phase-change devices, magnetic media such as disk drives, magnetic tape, optical media such as CDs, magneto-optical media, and hardware devices that are specially configured to store and perform program instructions, such as read-only memory devices (ROM) and random access memory (RAM). The computer readable media may be directly controlled by an end user or the media may be indirectly controlled by the end user. Examples of directly controlled media include the media located at a user facility and/or media that are not shared with other entities. Examples of indirectly controlled media include media that is indirectly accessible to the user via an external network and/or via a service providing shared resources such as the "cloud." Examples of program instructions include both machine code, such as produced by a compiler, and files containing higher level code that may be executed by the computer using an interpreter.

In various embodiments, the data or information employed in the disclosed methods and apparatus is provided in an electronic format. Such data or information may include design layouts, fixed parameter values, floated parameter values, feature profiles, metrology results, and the like. As used herein, data or other information provided in electronic format is available for storage on a machine and transmission between machines. Conventionally, data in electronic format is provided digitally and may be stored as bits and/or bytes in various data structures, lists, databases, etc. The data may be embodied electronically, optically, etc.

In certain embodiments, a process simulation model and/or a transfer function can each be viewed as a form of application software that interfaces with a user and with system software. System software typically interfaces with computer hardware and associated memory. In certain embodiments, the system software includes operating system software and/or firmware, as well as any middleware and drivers installed in the system. The system software provides basic non-task-specific functions of the computer. In contrast, the modules and other application software are used to accomplish specific tasks. Each native instruction for a module is stored in a memory device and is represented by a numeric value.

Figure 6:
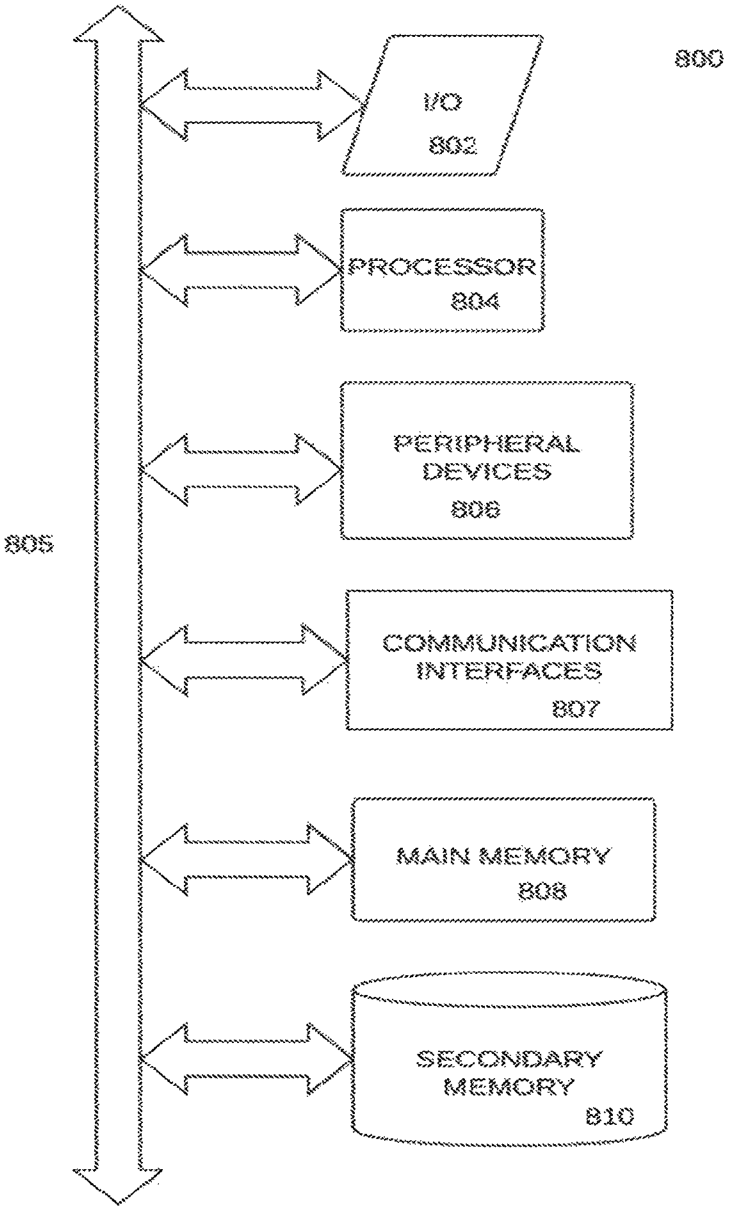
FIG. 6 shows an example computational system that may be used to optimize and/or use process simulation models, and/or generate transfer functions.

An example computer system 800 is depicted in FIG. 6. As shown, computer system 800 includes an input/output subsystem 802, which may implement an interface for interacting with human users and/or other computer systems depending upon the application. Embodiments of the invention may be implemented in program code on system 800 with I/O subsystem 802 used to receive input program statements and/or data from a human user (e.g., via a GUI or keyboard) and to display them back to the user. The I/O subsystem 802 may include, e.g., a keyboard, mouse, graphical user interface, touchscreen, or other interfaces for input, and, e.g., an LED or other flat screen display, or other interfaces for output.

Program code may be stored in non-transitory media such as persistent storage 810 or memory 808 or both. One or more processors 804 reads program code from one or more non-transitory media and executes the code to enable the computer system to accomplish the methods performed by the embodiments herein, such as those involved with generating or using a process simulation model as described herein. Those skilled in the art will understand that the processor may accept source code, such as statements for executing training and/or modeling operations, and interpret or compile the source code into machine code that is understandable at the hardware gate level of the processor. A bus couples the I/O subsystem 802, the processor 804, peripheral devices 806, memory 808, and persistent storage 810.

CONCLUSION

In the description, numerous specific details were set forth in order to provide a thorough understanding of the presented embodiments. The disclosed embodiments may be practiced without some or all of these specific details. In other instances, well-known process operations were not described in detail to not unnecessarily obscure the disclosed embodiments. While the disclosed embodiments were described in conjunction with the specific embodiments, it will be understood that the specific embodiments are not intended to limit the disclosed embodiments.

What is claimed is:

1. A method of generating a transfer function that relates segments on lithography photomasks to features produced by photolithography and etching using said segments, the method comprising:

(a) receiving after development inspection metrology results produced from one or more first test substrates on which resist was applied and patterned using a set of design layout segments;

(b) receiving after etch inspection metrology results produced from one or more second test substrates which were etched after resist was applied and patterned using said set of design layout segments; and (c) generating the transfer function using the set of design layout segments together with corresponding after development inspection metrology results and corresponding after etch inspection metrology results, wherein the transfer function is a model that predicts etched features from an input pre-lithography design layout segment, the predicted etched features being a predicted result of a sequence of a lithography process associated with the after development inspection metrology results followed by an etch process associated with the after etch inspection metrology results.

2. The method of claim 1, further comprising calibrating a computational resist model using the after development inspection metrology results.

3. The method of claim 2, wherein generating the transfer function comprises running the computational resist model multiple times to provide a set of predicted after development resist profiles.

4. The method of claim 1, further comprising calibrating a computational etch model using the after etch inspection metrology results.

5. The method of claim 4, wherein generating the transfer function comprises running the computational etch model multiple times to provide a set of predicted etch feature profiles.

6. The method of claim 1, wherein the after development inspection metrology results and/or the after etch inspection metrology results are provided in three dimensions.

7. The method of claim 1, wherein the after development inspection metrology results and/or the after etch inspection metrology results are provided as x-y contours using CD-SEM.

8. The method of claim 1, wherein the after development inspection metrology results and/or the after etch inspection metrology results are provided as x-z profiles using a TEM or CD-SAXS technique.

9. The method of claim 1, wherein the set of design layout segments includes clips or gauges provided in a GDS format.

10. The method of claim 1, further comprising applying an inverse of the transfer function to determine a design layout for a lithography mask.

11. A computer program product comprising a non-transitory computer readable medium on which is provided computer executable instructions for causing a computational system to generate a transfer function that relates segments on lithography photomasks to features produced by photolithography and etching using said segments, wherein the instructions comprise instructions for:

(a) receiving after development inspection metrology results produced from one or more first test substrates on which resist was applied and patterned using a set of design layout segments;

(b) receiving after etch inspection metrology results produced from one or more second test substrates which were etched after resist was applied and patterned using said set of design layout segments; and (c) generating the transfer function using the set of design layout segments together with corresponding after development inspection metrology results and corresponding after etch inspection metrology results, wherein the transfer function is a model that predicts etched features from an input pre-lithography design layout segment, the predicted etched features being a predicted result of a sequence of a lithography process associated with the after development inspection metrology results followed by an etch process associated with the after etch inspection metrology results.

12. The computer program product of claim 11, further comprising computer executable instructions for calibrating a computational resist model using the after development inspection metrology results.

13. The computer program product of claim 12, wherein the instructions for generating the transfer function comprise instructions for running the computational resist model multiple times to provide a set of predicted after development resist profiles.

14. The computer program product of claim 11, further comprising computer executable instructions for calibrating a computational etch model using the after etch inspection metrology results.

15. The computer program product of claim 14, wherein the instructions for generating the transfer function comprise instructions for running the computational etch model multiple times to provide a set of predicted etch feature profiles.

16. The computer program product of claim 11, wherein the after development inspection metrology results and/or the after etch inspection metrology results are provided in three dimensions.

17. The computer program product of claim 11, wherein the after development inspection metrology results and/or the after etch inspection metrology results are provided as x-y contours of CD-SEM-generated images.

18. The computer program product of claim 11, wherein the after development inspection metrology results and/or the after etch inspection metrology results are provided as x-z profiles of TEM or CD-SAXS-generated images.

19. The computer program product of claim 11, wherein the set of design layout segments includes clips or gauges provided in a GDS format.

20. The computer program product of claim 11, further comprising computer executable instructions for applying an inverse of the transfer function to determine a design layout for a lithography mask.

* * * * *